(12) United States Patent
Wooley et al.

(10) Patent No.: US 7,748,992 B1
(45) Date of Patent: Jul. 6, 2010

(54) METHODS AND SYSTEMS STACKABLE CIRCUIT BOARDS

(75) Inventors: Susan Wooley, Montrose, CA (US);
Glenn S. Kubota, Montrose, CA (US);
Dale Main, Montrose, CA (US)

(73) Assignee: Micro/Sys, Inc., Montrose, CA (US)

( * ) Notice: Subject to any disclaimer, the term of this patent is extended or adjusted under 35 U.S.C. 154(b) by 74 days.

(21) Appl. No.: 12/022,990

(22) Filed: Jan. 30, 2008

Related U.S. Application Data

(60) Provisional application No. 60/898,663, filed on Jan. 30, 2007, provisional application No. 60/899,222, filed on Feb. 1, 2007.

(51) Int. Cl.
*H01R 12/00* (2006.01)
(52) U.S. Cl. .................................. 439/74; 439/660
(58) Field of Classification Search ............ 439/74, 439/660; 361/735, 790
See application file for complete search history.

(56) References Cited

U.S. PATENT DOCUMENTS

| | | | |
|---|---|---|---|
| 3,676,777 A * | 7/1972 | Charters ................ | 324/754 |
| 6,075,704 A * | 6/2000 | Amberg et al. ............... | 361/736 |
| 2002/0089804 A1* | 7/2002 | Chea, Jr. ..................... | 361/119 |
| 2005/0018371 A1* | 1/2005 | Mladenik et al. ............... | 361/78 |
| 2007/0076340 A1* | 4/2007 | Ewing et al. ................... | 361/62 |
| 2007/0296596 A1* | 12/2007 | Moore ..................... | 340/572.7 |

* cited by examiner

*Primary Examiner*—Renee Luebke
*Assistant Examiner*—Larisa Tsukerman
(74) *Attorney, Agent, or Firm*—Sheppard Mullin Richter & Hampton LLP

(57) ABSTRACT

The present invention is directed toward methods and systems for providing a stackable connector system comprising a switching device configured to select a signal based on a location of a first circuit board above or below a second circuit board. A sense line may be coupled to a location signal and configured to indicate if the first circuit board is above or below the second circuit board. Additionally, a first connector, including a first conductor element, may be located on the first circuit board and a second connector, including a second conductor element, may be located on the first circuit board. An electrical connection element on the first circuit board mat connect the first conductor element to the second conductor element, wherein the location of the first conductor element in the first connector is offset relative to the location of the second conductor element in the second connector.

25 Claims, 25 Drawing Sheets

Dimensions are shown in millimeters

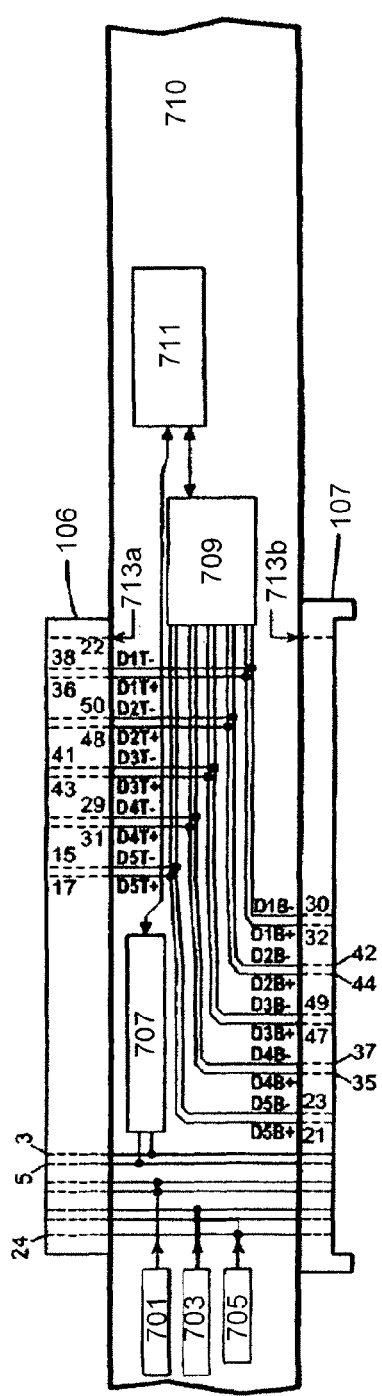
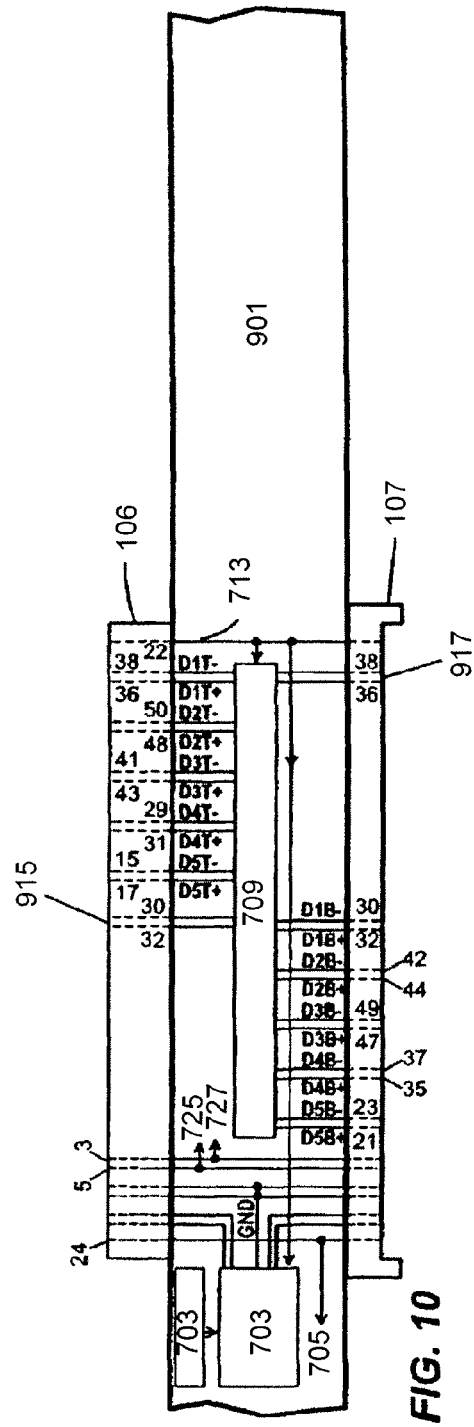
FIG. 9
FIG. 10

| Pin 1 | GND | | GND | Pin 2 |
|---|---|---|---|---|
| Pin 3 | I2C_SCK | | +3.3V | Pin 4 |
| Pin 5 | I2C_SDA | | +3.3V | Pin 6 |
| Pin 7 | GND | | GND | Pin 8 |
| Pin 9 | Reserved1 | | +3.3V | Pin 10 |
| Pin 11 | Reserved2 | | +5V | Pin 12 |
| Pin 13 | GND | | GND | Pin 14 |
| Pin 15 | D5T- | | +5V | Pin 16 |
| Pin 17 | D5T+ | | +5V | Pin 18 |
| Pin 19 | GND | | GND | Pin 20 |
| Pin 21 | UNUSED | G | SENSE+ | Pin 22 |
| Pin 23 | UNUSED | N | RST# | Pin 24 |
| Pin 25 | GND | D | GND | Pin 26 |
| Pin 27 | GND | | GND | Pin 28 |
| Pin 29 | D4T- | | UNUSED | Pin 30 |
| Pin 31 | D4T+ | | UNUSED | Pin 32 |
| Pin 33 | GND | | GND | Pin 34 |
| Pin 35 | UNUSED | | D1T+ | Pin 36 |
| Pin 37 | UNUSED | | D1T- | Pin 38 |
| Pin 39 | GND | | GND | Pin 40 |
| Pin 41 | D3T- | | UNUSED | Pin 42 |
| Pin 43 | D3T+ | | UNUSED | Pin 44 |
| Pin 45 | GND | | GND | Pin 46 |
| Pin 47 | UNUSED | | D2T+ | Pin 48 |
| Pin 49 | UNUSED | | D2T- | Pin 50 |
| Pin 51 | GND | | GND | Pin 52 |
| | | Pin 53 | | |

Processor Board - Pin Assignment of the Signals for the First Connector (Top Connector)

FIG. 14

| Pin 1  | GND      |       | GND    | Pin 2  |
|--------|----------|-------|--------|--------|
| Pin 3  | I2C_SCK  |       | +3.3V  | Pin 4  |
| Pin 5  | I2C_SDA  |       | +3.3V  | Pin 6  |
| Pin 7  | GND      |       | GND    | Pin 8  |
| Pin 9  | Reserved1|       | +3.3V  | Pin 10 |
| Pin 11 | Reserved2|       | +5V    | Pin 12 |
| Pin 13 | GND      |       | GND    | Pin 14 |
| Pin 15 | UNUSED   |       | +5V    | Pin 16 |
| Pin 17 | UNUSED   |       | +5V    | Pin 18 |
| Pin 19 | GND      |       | GND    | Pin 20 |
| Pin 21 | D5B+     |       | SENSE- | Pin 22 |
| Pin 23 | D5B-     | G N D | RST#   | Pin 24 |
| Pin 25 | GND      |       | GND    | Pin 26 |
| Pin 27 | GND      |       | GND    | Pin 28 |
| Pin 29 | UNUSED   |       | D1B-   | Pin 30 |
| Pin 31 | UNUSED   |       | D1B+   | Pin 32 |
| Pin 33 | GND      |       | GND    | Pin 34 |
| Pin 35 | D4B+     |       | UNUSED | Pin 36 |
| Pin 37 | D4B-     |       | UNUSED | Pin 38 |
| Pin 39 | GND      |       | GND    | Pin 40 |
| Pin 41 | UNUSED   |       | D2B-   | Pin 42 |
| Pin 43 | UNUSED   |       | D2B+   | Pin 44 |
| Pin 45 | GND      |       | GND    | Pin 46 |
| Pin 47 | D3B+     |       | UNUSED | Pin 48 |
| Pin 49 | D3B-     |       | UNUSED | Pin 50 |
| Pin 51 | GND      |       | GND    | Pin 52 |
|        |          | Pin 53|        |        |

Processor Board - Mirror Image of the Pin Assignment of the Signals for the Second Connector (Bottom Connector)

FIG. 15

| Pin 1 | GND | | GND | Pin 2 |
|---|---|---|---|---|
| Pin 3 | I2C_SCK | | +3.3V | Pin 4 |
| Pin 5 | I2C_SDA | | +3.3V | Pin 6 |
| Pin 7 | GND | | GND | Pin 8 |
| Pin 9 | Reserved1 | | +3.3V | Pin 10 |
| Pin 11 | Reserved2 | | +5V | Pin 12 |
| Pin 13 | GND | | GND | Pin 14 |
| Pin 15 | UNUSED | | +5V | Pin 16 |
| Pin 17 | UNUSED | | +5V | Pin 18 |
| Pin 19 | GND | | GND | Pin 20 |
| Pin 21 | D5B+ | G | SENSE | Pin 22 |
| Pin 23 | D5B- | N | RST# | Pin 24 |
| Pin 25 | GND | D | GND | Pin 26 |
| Pin 27 | GND | | GND | Pin 28 |
| Pin 29 | D5T- | | D1B- | Pin 30 |
| Pin 31 | D5T+ | | D1B+ | Pin 32 |
| Pin 33 | GND | | GND | Pin 34 |
| Pin 35 | D4B+ | | D2T+ | Pin 36 |
| Pin 37 | D4B- | | D2T- | Pin 38 |
| Pin 39 | GND | | GND | Pin 40 |
| Pin 41 | D4T- | | D2B- | Pin 42 |
| Pin 43 | D4T+ | | D2B+ | Pin 44 |
| Pin 45 | GND | | GND | Pin 46 |
| Pin 47 | D3B+ | | D3T+ | Pin 48 |
| Pin 49 | D3B- | | D3T- | Pin 50 |
| Pin 51 | GND | | GND | Pin 52 |
| | | Pin 53 | | |

*Peripheral Board - Pin Assignment of the Signals for the First Connector (Top Connector)*

FIG. 16

| Pin 1  | GND      | | GND   | Pin 2  |
|--------|----------|---|-------|--------|
| Pin 3  | I2C_SCK  | | +3.3V | Pin 4  |
| Pin 5  | I2C_SDA  | | +3.3V | Pin 6  |
| Pin 7  | GND      | | GND   | Pin 8  |
| Pin 9  | Reserved1| | +3.3V | Pin 10 |
| Pin 11 | Reserved2| | +5V   | Pin 12 |
| Pin 13 | GND      | | GND   | Pin 14 |
| Pin 15 | D5T-     | | +5V   | Pin 16 |
| Pin 17 | D5T+     | | +5V   | Pin 18 |
| Pin 19 | GND      | | GND   | Pin 20 |
| Pin 21 | UNUSED   | G | SENSE | Pin 22 |
| Pin 23 | UNUSED   | N | RST#  | Pin 24 |
| Pin 25 | GND      | D | GND   | Pin 26 |
| Pin 27 | GND      | | GND   | Pin 28 |
| Pin 29 | D4T-     | | D2B-  | Pin 30 |
| Pin 31 | D4T+     | | D2B+  | Pin 32 |
| Pin 33 | GND      | | GND   | Pin 34 |
| Pin 35 | D5B+     | | D1T+  | Pin 36 |
| Pin 37 | D5B-     | | D1T-  | Pin 38 |
| Pin 39 | GND      | | GND   | Pin 40 |
| Pin 41 | D3T-     | | D3B-  | Pin 42 |
| Pin 43 | D3T+     | | D3B+  | Pin 44 |
| Pin 45 | GND      | | GND   | Pin 46 |
| Pin 47 | D4B+     | | D2T+  | Pin 48 |
| Pin 49 | D4B-     | | D2T-  | Pin 50 |
| Pin 51 | GND      | | GND   | Pin 52 |
|        |          | Pin 53 | | |

*Peripheral Board - Mirror Image of the Pin Assignment of the Signals for the Second Connector (Bottom Connector)*

FIG. 17

| Pin 1 | GND | | GND | Pin 2 |
|---|---|---|---|---|
| Pin 3 | I2C_SCK | | +3.3V * | Pin 4 |
| Pin 5 | I2C_SDA | | +3.3V * | Pin 6 |
| Pin 7 | GND | | GND | Pin 8 |
| Pin 9 | Reserved1 | | +3.3V * | Pin 10 |
| Pin 11 | Reserved2 | | +5V * | Pin 12 |
| Pin 13 | GND | | GND | Pin 14 |
| Pin 15 | D5T- | | +5V * | Pin 16 |
| Pin 17 | D5T+ | | +5V * | Pin 18 |
| Pin 19 | GND | | GND | Pin 20 |
| Pin 21 | UNUSED | G | SENSE | Pin 22 |
| Pin 23 | UNUSED | N | RST# | Pin 24 |
| Pin 25 | GND | D | GND | Pin 26 |
| Pin 27 | GND | | GND | Pin 28 |
| Pin 29 | D4T- | | D1B- | Pin 30 |
| Pin 31 | D4T+ | | D1B+ | Pin 32 |
| Pin 33 | GND | | GND | Pin 34 |
| Pin 35 | UNUSED | | D1T+ ** | Pin 36 |
| Pin 37 | UNUSED | | D1T- ** | Pin 38 |
| Pin 39 | GND | | GND | Pin 40 |
| Pin 41 | D3T- | | UNUSED | Pin 42 |
| Pin 43 | D3T+ | | UNUSED | Pin 44 |
| Pin 45 | GND | | GND | Pin 46 |
| Pin 47 | UNUSED | | D2T+ | Pin 48 |
| Pin 49 | UNUSED | | D2T- | Pin 50 |
| Pin 51 | GND | | GND | Pin 52 |
| | | Pin 53 | | |

*Hub Board - Pin Assignment of the Signals for the First Connector (Top Connector)*

\* Hub boards are self-powered. The power (+3.3V and +5V) pins of the Hub Top Connector are not tied to the power pins of the Hub Bottom Connector.

\*\* D1T+ and D1T- are outputs from the hub board and are not connected to the signals of the same name on the hub Bottom Connector, which are inputs to the Hub board.

*FIG. 18*

| | | | | |
|---|---|---|---|---|
| Pin 1 | GND | | GND | Pin 2 |
| Pin 3 | I2C_SCK | | +3.3V † | Pin 4 |
| Pin 5 | I2C_SDA | | +3.3V † | Pin 6 |
| Pin 7 | GND | | GND | Pin 8 |
| Pin 9 | Reserved1 | | +3.3V † | Pin 10 |
| Pin 11 | Reserved2 | | +5V † | Pin 12 |
| Pin 13 | GND | | GND | Pin 14 |
| Pin 15 | UNUSED | | +5V † | Pin 16 |
| Pin 17 | UNUSED | | +5V † | Pin 18 |
| Pin 19 | GND | | GND | Pin 20 |
| Pin 21 | D5B+ | G | SENSE | Pin 22 |
| Pin 23 | D5B- | N | RST# | Pin 24 |
| Pin 25 | GND | D | GND | Pin 26 |
| Pin 27 | GND | | GND | Pin 28 |
| Pin 29 | UNUSED | | D1B- †† | Pin 30 |
| Pin 31 | UNUSED | | D1B+ †† | Pin 32 |
| Pin 33 | GND | | GND | Pin 34 |
| Pin 35 | D4B+ | | D1T+ | Pin 36 |
| Pin 37 | D4B- | | D1T- | Pin 38 |
| Pin 39 | GND | | GND | Pin 40 |
| Pin 41 | UNUSED | | D2B- | Pin 42 |
| Pin 43 | UNUSED | | D2B+ | Pin 44 |
| Pin 45 | GND | | GND | Pin 46 |
| Pin 47 | D3B+ | | UNUSED | Pin 48 |
| Pin 49 | D3B- | | UNUSED | Pin 50 |
| Pin 51 | GND | | GND | Pin 52 |
| | | Pin 53 | | |

Hub Board - Mirror Image of the Pin Assignment of the Signals for the Second Connector (Bottom Connector)

† Hub boards are self powered. The power (+3.3V and +5V) pins of the Hub Bottom Connector are not tied to the power pins of the Hub Top Connector.

†† D1B+ and D1B- are outputs from the Hub board and are not connected to to signals of the same name on the Hub Top Connector, which are inputs to the Hub board.

*FIG. 19*

METHODS AND SYSTEMS STACKABLE CIRCUIT BOARDS

RELATED APPLICATION INFORMATION

This application claims priority to provisional application 60/898,663 filed Jan. 30, 2007 and provisional application 60/899,222 filed Feb. 1, 2007, each of which is incorporated herein by reference.

FIELD OF THE INVENTION

The present invention relates generally to circuit boards, and more particularly, some embodiments relate to methods and systems for stackable circuit boards.

BACKGROUND OF THE INVENTION

Embedded systems are used in a wide variety of applications from simple control applications to complex real-time systems. Such a system commonly comprises of a processor board and several peripheral boards that are stacked above the processor board, with a parallel bus provided from the processor board to the peripheral boards through a stack of interconnecting connectors on the boards. The processor board may be called a single-board computer or SBC for short. Each peripheral board can provide a wide variety of functions, ranging from data acquisition, signal generation, control circuitry, computation circuitry, data storage, communication, and other types of specialized circuitry. Embedded systems often need to be rugged, and board-to-board communications need to be fast. If the parallel bus used to convey data to and from the processor board and the peripheral boards has the least number of signals it might be less likely to fail and may have fast throughput which might be a desired characteristic in some systems. Additionally, it may be preferable for a system to maintain electrical connectivity despite vibrations encountered by the system. A system with fewer pins might be more likely to maintain this connectivity because fewer pins may lead to a lower probability of failure of any of the pins.

As part of making their inventions, the inventors have recognized that embedded-system applications will require buses with greater speed and throughput but fewer signals than those provided by present buses used in embedded systems, and that such buses will need to serve larger numbers of peripheral boards. Parallel bus structures may require many signals to make board-to-board connections. This may lead to a reduction in system reliability due to reduced signal integrity and an increased number of mechanical connections. Additionally, many systems may have bandwidth constraints as multiple peripheral boards consume, or "dirty," the available bandwidth in parallel bus connections. This may limit the number of devices that can be placed on the bus, which effectively limits the systems' expandability. In addition, parallel buses may not allow peripheral boards to be installed and removed while the system is operating. In other words, many parallel buses do not support "hot-pluggable" boards.

BRIEF SUMMARY OF THE INVENTION

The present invention is directed toward methods and systems for providing a stackable connector system comprising a multiplexer or other switching device configured to select a signal based on a location of a first circuit board above or below a second circuit board. In some embodiments, a sense line may be coupled to a location signal and configured to indicate if the first circuit board is above or below the second circuit board. Additionally, a first connector, including a first conductor element, and a second connector, including a second conductor element, may be located on the first circuit board. An electrical connection element on the first circuit board may connect the first conductor element to the second conductor element, wherein the location of the first conductor element in the first connector may be offset relative to the location of the second conductor element in the second connector.

Some embodiments may use connections that offset from the bottom connector of a printed circuit board to the top connector of the same board. Offset connections allow an individual connection to be established between the processor or other type of board and each board located above or below it. In various embodiments, the first connection may be used by the first board in a stack, e.g., the first board above the processor board. The remaining connections may be shifted over in position to replace the connection used by the first board in the stack. This may continue until, for example, all available connections are used. A stack located below the processor board may also use board shifting in this way. Additionally, by isolating the two inputs between the top and bottom sets of boards the individual connections between each of the boards and the processor board become point to point. In this way, we can avoid a stub that may be created by additional boards in a board stack. Stubs may cause ringing in high speed transmission lines. Isolation may be used in some embodiments to eliminate the stub length, which may reduce ringing. In some embodiments, this may improve signal transmission.

In accordance with some embodiments of the systems and methods described herein, the stackable connector system may include a first conductor element that comprises a pin and a second conductor element that comprises a pin receptacle. Additionally, in various embodiments, the electrical connection element may comprise a trace on a circuit board.

In accordance with some embodiments of the systems and methods described herein, the stackable connector system may include a sense line that couples the location signal to the multiplexer through a connection between the first and second connector. In some embodiments, the signal selected based on the location of the first circuit board may comprise a signal connected from the first circuit board to the second circuit board through the first and second conductor elements in the first and second connectors.

In accordance with some embodiments of the systems and methods described herein, the stackable connector system may include a Universal Serial Bus signal coupled to the first and second conductor elements comprises.

In accordance with some embodiments of the systems and methods described herein, the stackable connector system may include a location signal coupled to the sense line. In some embodiments, the location signal may be generated by the second circuit board. The second circuit board may be, for example, a processor board and the first circuit board may be a peripheral board. Additionally, multiple peripheral boards may be used and these peripheral boards may be configured to communicate serially with the processor board through separate connections within a connector pair.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

FIG. 9 is a partial cross-sectional circuit diagram of a second exemplary processor board according to the methods and systems described herein.

FIG. 10 is a partial cross-sectional circuit diagram of an exemplary hub board according to the methods and systems described herein.

FIGS. 14-19 illustrate plan views of the pins of the first and second connectors of the exemplary processor, peripheral, and hub boards, and the exemplary signal assignments that illustrate the methods and systems described herein.

The figures are not intended to be exhaustive or to limit the invention to the precise form disclosed. It should be understood that the invention can be practiced with modification and alteration, and that the invention be limited only by the claims and the equivalents thereof.

DESCRIPTION OF THE PREFERRED EMBODIMENTS

The present invention is directed toward methods and systems for providing a stackable connector system comprising a multiplexer or other switching device configured to select a signal based on a location of a first circuit board above or below a second circuit board. In some embodiments, a sense line may be coupled to a location signal and configured to indicate if the first circuit board is above or below the second circuit board. Additionally, a first connector, including a first conductor element, and a second connector, including a second conductor element, may be located on the first circuit board. An electrical connection element on the first circuit board may connect the first conductor element to the second conductor element, wherein the location of the first conductor element in the first connector may be offset relative to the location of the second conductor element in the second connector.

Figure 1:
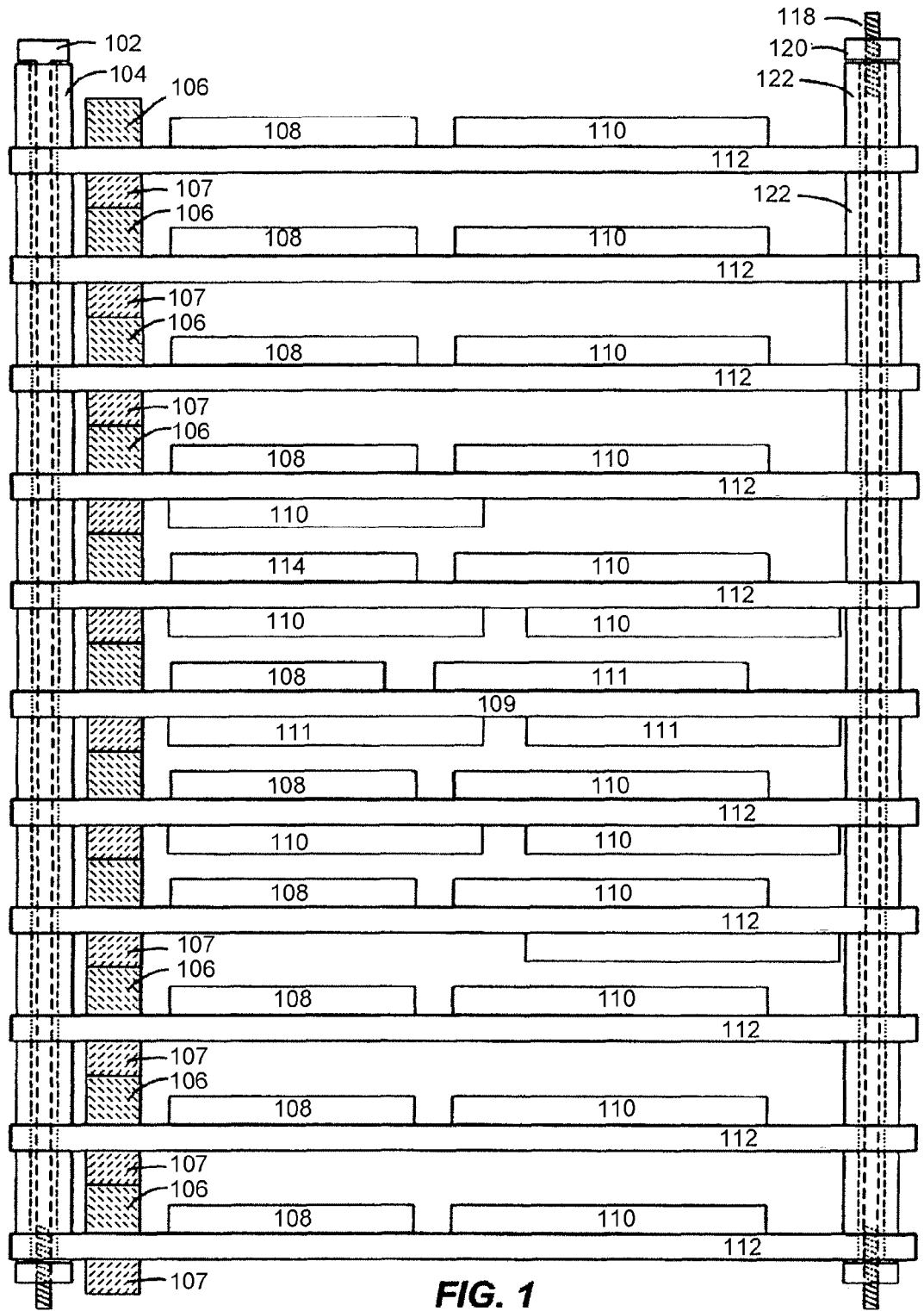
FIG. 1 illustrates a side view of an exemplary embedded system employing the processor boards and peripheral boards according to the methods and systems described herein.

Before describing the invention in detail, it is useful to describe an example environment with which the invention can be implemented. FIG. 1 illustrates a side view of an exemplary system employing the processor boards 111 and peripheral boards 112 according to the present inventions. Eleven exemplary boards are illustrated in a stacked arrangement. An exemplary processor board 111 is illustrated in the middle, five peripheral boards 112 are stacked above the processor board 111, and five peripheral boards 112 are stacked below the processor board 111. The eleven boards have some common features, and features which differentiate them.

Figure 2:
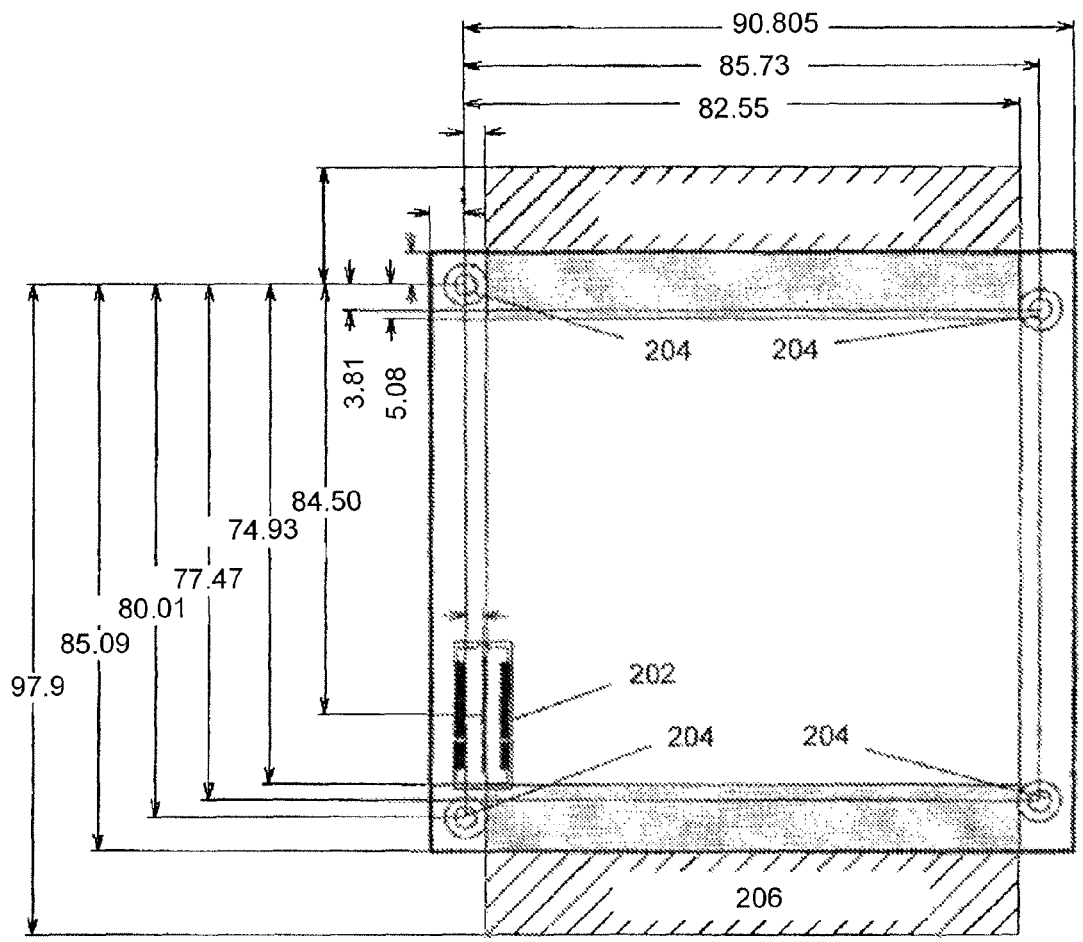
FIG. 2 is a top plan view of common features of the processor, peripheral, and hub boards according to the methods and systems described herein.

The common features are described first, with reference to FIGS. 1 and 2, where FIG. 2 is a top plan view of the common features of the boards. Each board comprises a substrate having a top surface, a bottom surface, and in some embodiments, a rectangular shape with four sides (other embodiments may have other shapes, and a different number of sides) Each board may further comprises a pattern of mounting holes 204 spaced at predetermined distances from one another, as illustrated in FIG. 2. Each board may comprise a first connector 202 and a second connector (not illustrated); however, some implementations may omit one of the two connectors (such as a processor board that only allows stacking of peripheral boards above one of its surfaces). The first multi-pin connector may be disposed on the top surface of the board's substrate in a first predetermined relation to the mounting holes. The second multi-pin connector may be disposed on the bottom surface of the board's substrate in a second predetermined relation to the mounting holes. In some embodiments, the first and second predetermined relationships may be mirror images of one another. Some embodiments may include male connectors and female connectors. These connectors may be arranged so that the connectors on one board may mate with boards that are above and below it. In other embodiments, the images may be identical. As such, a board's second multi-pin connector may be disposed on the bottom surface of the board's substrate below the board's first multi-pin connector such that the second connector inter-fits with the first connector of another board when disposed below the other board, with the mounting holes of both boards aligned.

The boards maybe secured to one another by a plurality of plain spacers disposed between the opposing mounting holes of adjacent boards, and four rods 118 disposed through the spacers 122 and mounting holes 204, as illustrated in FIGS. 1 (the side view only illustrates two rods, and half of the spacers) and 2. Each spacer comprises a through-hole through which a rod may pass. The spacer may comprise electrically insulating material, for example, nylon. The use of an electrically insulating material, however, is not required. A spacer's height may be substantially equal to the height of an inter-fitted set of first and second connectors or slightly higher. For example, in some embodiments, the spacer's height may be approximately 15.24 mm. It will be understood that the height of the spacer can vary from implementation to implementation. For example, based on, for example, the size of the components on the boards. For example, the spacer thickness may vary based on the connectors selected in the design.

One or both ends of each rod 118 may be threaded to enable a nut 120 to be fasted thereto. In some embodiments, one end of a rod 118 may comprise a bolt end 102, an example of which is illustrated in FIG. 1. In other embodiments, instead of using rods and plain spacers, the boards may be secured using interconnecting spacers 122. Each such spacer has female threads on one end and male threads on the other. Two interconnecting spacers may be secured to one another with a mounting hole of a board disposed between the spacers. This might be done for all of the boards of a system. These constructions enable the connectors between the boards to be secured so as to minimize the chances of vibrations to the system interfering with the electrical connectivity of the pins in the connectors.

Figure 3:
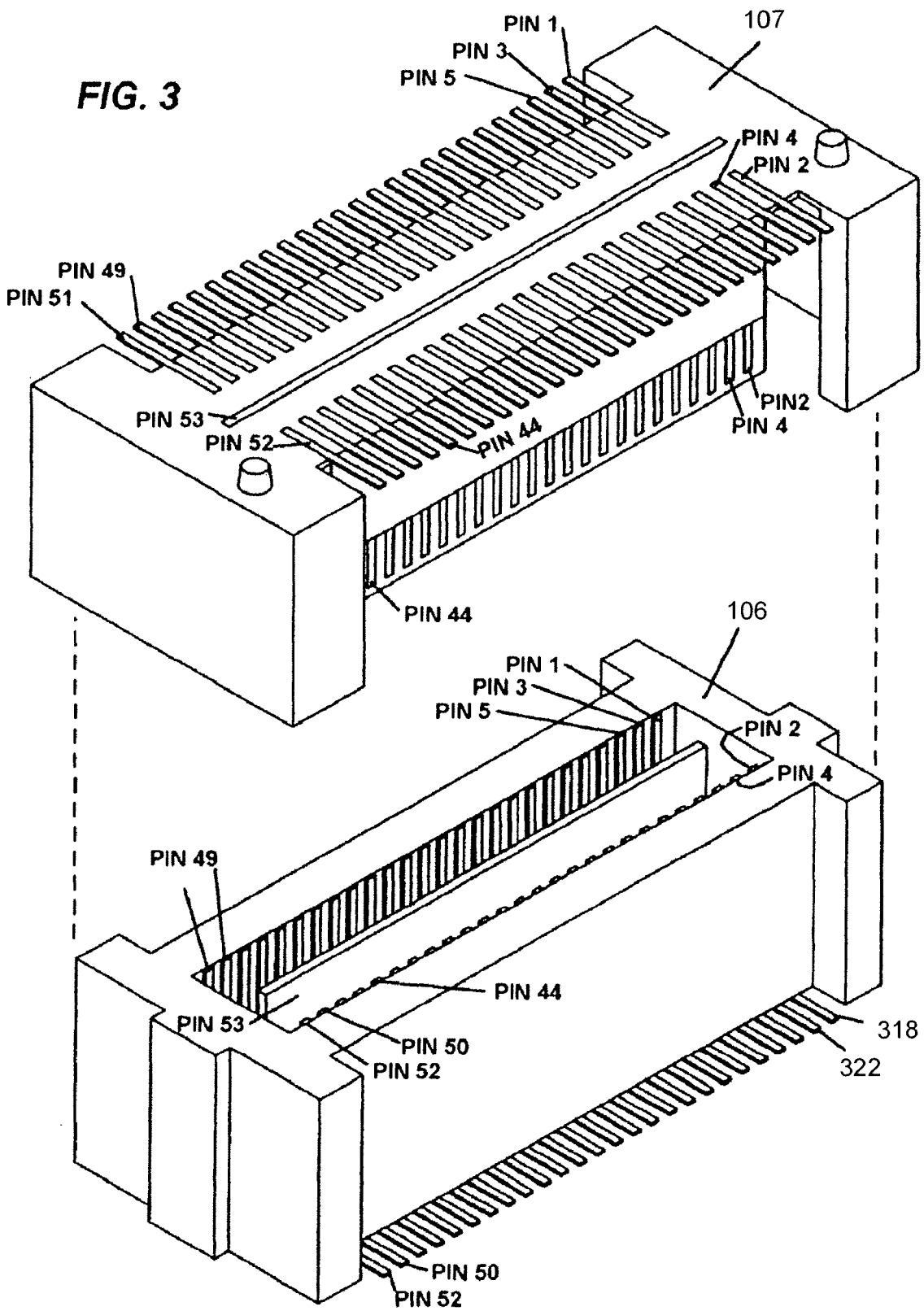
FIG. 3 is a perspective view of exemplary first and second connectors that may be used in implementing the boards according to the methods and systems described herein.

An exemplary set of first and second connectors is illustrated in a perspective view in FIG. 3. The first connector in the illustration may be disposed on a lower board, whereas the second connector may be disposed on an upper board disposed above the lower board. In the example of FIG. 3, each of the first and second connectors (i.e., 106, 107, respectively) has a respective array of 52 pins, numbered as pins 1 through 52, and a centrally disposed ground bar, which may be numbered as pin 53.

In both of the first and second connectors, odd-numbered pins 1, 3, 5, . . . , 49, and 51 are disposed in back of ground pin 53, and even-numbered pins 2, 4, . . . 50, and 52 are disposed in front of ground pin 53, as illustrated in FIG. 3. In addition, pin 2 may be disposed opposite pin 1, pin 4 may be disposed opposite pin 3, and so forth. The constructions of the first and second connectors enable the connectors to inter-fit within one another, where the constructions are adapted to electrically couple the array of pins of the first connector with the array of pins of the second connector on a pin-by-pin basis, with like pin numbers making electrical connection to one another. For example, that pin 1 of the first connector may be electrically coupled to pin 1 of the second connector when the connectors are inter-fitted, pin 2 of the first connector may be electrically coupled to pin 2 of the second connector when the connectors are inter-fitted, and so forth.

Figure 4:
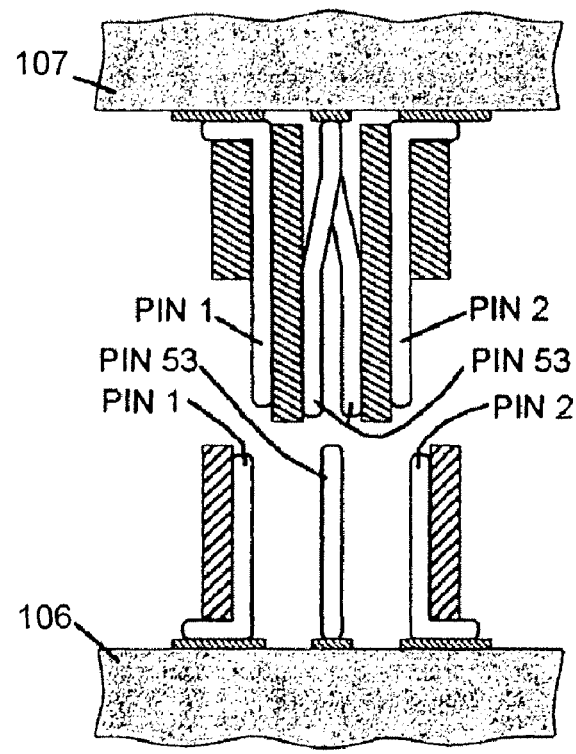
FIG. 4 is a cross-sectional view of the exemplary first and second connectors of FIG. 3 before the connectors are interfitted according to the methods and systems described herein.
Figure 5:
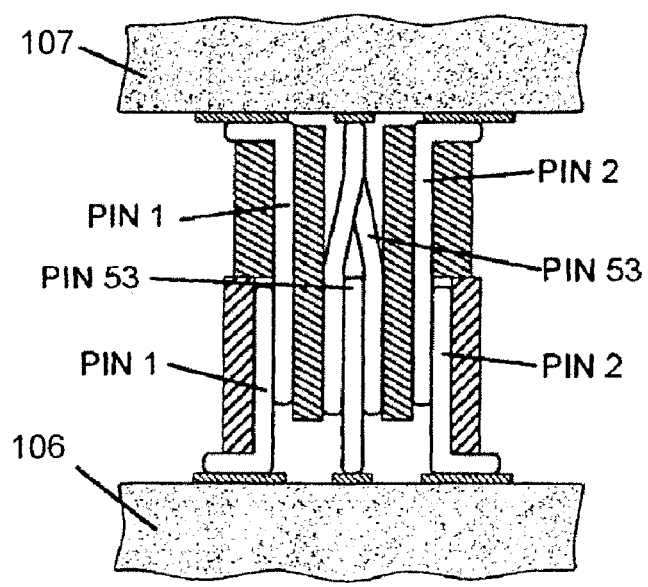
FIG. 5 is a cross-sectional view of the exemplary first and second connectors of FIG. 3 after the connectors are interfitted according to the methods and systems described herein.

FIG. 4 illustrates a cross-sectional view of the connectors taken through pins 1 and 2 before the connectors are inter-fitted, and FIG. 5 illustrates a cross-sectional view of the connectors 106 and 107 taken through pins 1 and 2 after the connectors have been inter-fitted. As can be seen in FIG. 1, instances of the first connector 106 and the second connectors 107 are disposed on opposite-facing boards. As is described below, various pairs of pins of the first connector will be designated to convey respective USB lines, which will convey these USB lines to corresponding pins of the second connector having the same number assignments.

Referring back to FIG. 1, data may be conveyed between the processor board and each of the peripheral boards by way of a plurality of universal-serial bus (USB) lines, with one differential pair of lines serving each of the peripheral boards in the configuration illustrated in FIG. 1. It will be understood that other protocols might used different numbers of tines. For example, some protocols might use a single line, others protocols might use differential lines similarly to the USB protocol. In yet other embodiments, more than two lines may be used.

Figure 6:
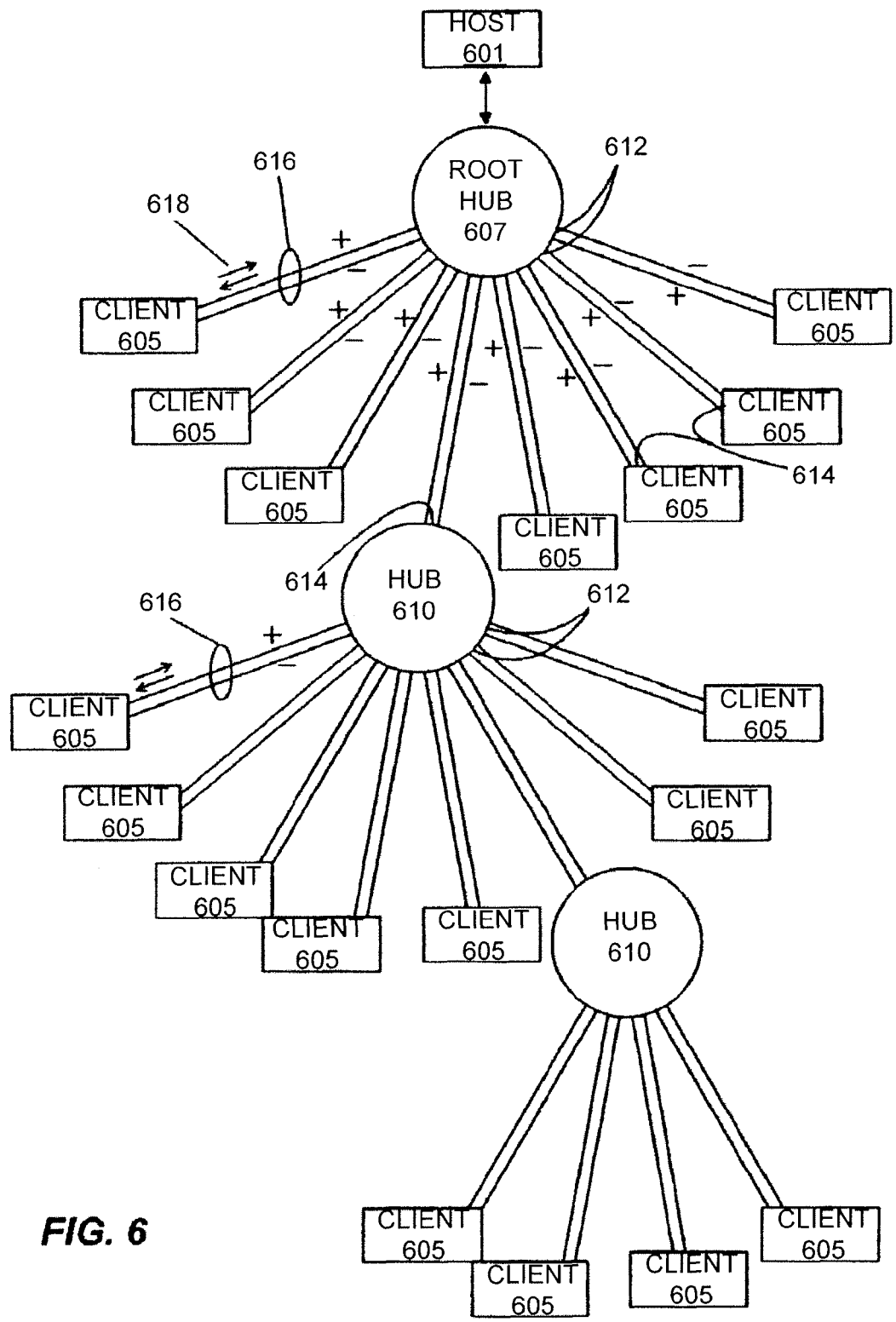
FIG. 6 illustrates the tiered-star topology of the universal serial bus protocol.

Referring now to FIG. 6, in the USB communication protocol, a root hub 607 directly couples to a plurality of clients over respective USB lines 616, where each USB line comprises two wires to carry signals in differential form. In some embodiments, a maximum of seven directly-coupled clients 605 may be available. The two lines are indicated by the "+" and "−" symbols in FIG. 6. In various embodiments, the root hub 607 may be disposed on the processor board, and each of the peripheral boards might be a client 605. Each USB line can convey data packets from the root hub 607 to the respective client 605, and from the respective client 605 to the root hub 607. For example, in some embodiments, the USB line may be bidirectional 618.

In some embodiments, the root hub might establish a repeating frame of data packets. A first part of each frame may be used to convey packets from the root hub 607 to all of the clients 605. Additionally, a second part of the frame may be used to allocate time slots to each of the clients 605 for them to transmit data packets to the root hub 607. The root hub can vary the durations of the first and second parts and the durations of the time slots, for example, to meet the bandwidth demands of the clients. The root hub 607 receives data to transmit to the clients 605 from a host, which in our case can be a processor on a processor board, and provides the data it receives from the clients to the host. This effectively sets up several point-to-point communication links between the host and the clients (peripheral boards), with the root hub handling the routing of the data. The host may be coupled to the root hub 607 with any type of processor-side bus, typically a high-speed parallel bus. The data is said to flow "downstream" 612 from the root hub to the clients, and to flow "upstream" 614 from the clients to the root hub.

One or more of the clients directly coupled to a root hub may be a regular USB hub 610, which allows additional clients to be served by routing data packets through the regular USB hub 610. In turn, a second regular USB hub 610 may be coupled as a client to the first regular USB hub 610, in order to serve additional clients. In some embodiments, up to six regular hubs, for example, may be serially connected in a chain, for a total of seven tiers of hubs 610 (including the root hub 607).

Each root hub 607 and regular hub 610 may have a plurality of downstream ports 612 for coupling to clients and to other regular hubs, and each regular hub and each client has an upstream port 614 to couple to a regular hub or the root hub. A regular hub receives data packets from its upstream port 614, and transmits the received packets to all of its clients on its downstream ports 612. A regular hub also receives packets from its clients on respective ones of the downstream ports 612, and transmits these packets to its upstream port 614 (not to the other downstream ports 612).

The topology illustrated in FIG. 6 is referred to as a "tiered-star topology" because the clients 605 of each hub 610 are connected in a star topology of point-to-point communications to the hub, and the hubs may be tiered. The routing of data packets to and from the clients may be handled by the root hub 607, and might be configured and implemented by software running on a controller of the root hub. In some embodiments, the routing of the data packets may be similar to addressing. No address lines, however, are used in the USB protocol. More information on the USB protocol is readily available on the Internet, and in the document entitled "Universal Serial Bus Specification," Revision 2.0, dated Apr. 27, 2000, the contents of which are incorporated herein by reference.

Figure 7:
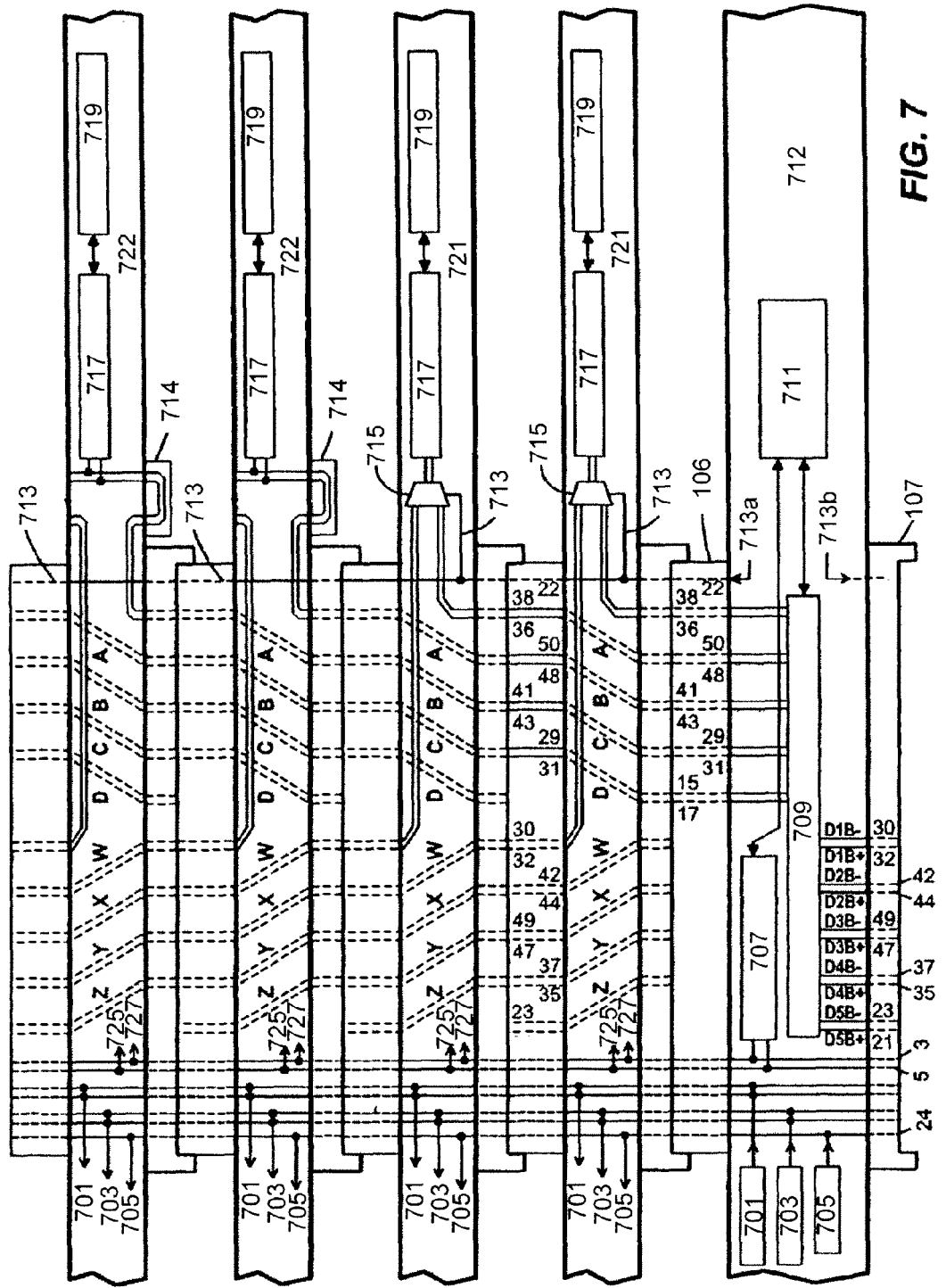
FIG. 7 is a partial cross-sectional circuit diagram illustrating the electrical connections in the top portion of the exemplary system illustrated in FIG. 1 according to the methods and systems described herein.

FIG. 7 is a partial cross-sectional circuit diagram illustrating the electrical connections in the top portion of the system illustrated in FIG. 1. As illustrated in FIG. 7, a system for providing a stackable connector system may comprising a multiplexer 715 or other switching device configured to select a signal based on a location of a first circuit board above or below a second circuit board. In some embodiments, a sense line 713 may be coupled to a location signal and configured to indicate if the first circuit board is above or below the second circuit board. For example, in some embodiments, a sense+ signal might be routed to boards (721,722) located above a processor board to indicate that a board is stacked above the processor board 712. Similarly, a sense-signal might be routed to board located below the processor board to indicate that a board is in a stack located below the processor board.

Additionally, in some embodiments, a first connector 106, including a first conductor element, and a second connector 107, including a second conductor element, may be located on the first circuit board. For example, several connectors, routing several signals are illustrated in FIG. 7 and are discussed below.

An electrical connection element on the first circuit board may connect the first conductor element to the second conductor element, wherein the location of the first conductor element in the first connector 106 may be offset relative to the location of the second conductor element in the second connector 107. For example, as illustrated in FIG. 7, various conductors Z, Y, X, W, D, C, B, and A route from various conductor element in a connector to other conductor elements in a second connector. In various embodiments, these electrical connection elements may comprise traces on the circuit board. For example, in some embodiments, the traces may provide a connection between surface mount connectors that can be used to connect one board to another.

In accordance with some embodiments of the systems and methods described herein, the stackable connector system may include a first conductor element that comprises a pin and a second conductor element that comprises a pin receptacle. It will be understood by those of skill in the art, however, that many different connection systems might be used in conjunction with the systems and methods described herein. For example, the connectors may be surface mount connectors. Additionally, the connectors may be selected based on the bandwidth capability of the connector. For example, a high bandwidth signal will generally require a connector capable of transmitting such a signal.

In accordance with some embodiments of the systems and methods described herein, the stackable connector system may include a sense line 713. The sense line may couple the location signal to, for example, a multiplexer 715. This connection may be made through a connection between the first connector 106 and the second connector 107. In some embodiments, the signal selected based on the location of the first circuit board may comprise a signal connected from the first circuit board to the second circuit board through the first and second conductor elements in the first and second connectors.

In accordance with some embodiments of the systems and methods described herein, the stackable connector system may include a Universal Serial Bus signal coupled to the first and second conductor elements. It will be understood, however, that other types of signals might be used. For example, the systems and methods described herein might be used in conjunction with PCIe, GB Ethernet, or other signaling architectures.

In accordance with some embodiments of the systems and methods described herein, the stackable connector system may include a location signal coupled to the sense line. This location signal might be generated by the second circuit board, such as a processor board. The processor board might include one or more processors, microprocessors, digital logic, or other circuitry. Additionally, the circuit board or circuit boards attached to the processor board may be peripheral board(s). These peripheral boards might be configured to communicate serially with the processor board through separate connections, as illustrated in FIG. 7 and discussed below.

As discussed above, various embodiments of the methods and systems described herein may include exemplary processor boards, exemplary peripheral boards or exemplary connector structures that may use a plurality of universal-serial-bus (USB) lines to convey data in a point-to-point manner between an exemplary processor board and each of the peripheral boards in the system, while maintaining the intended star-topology of the USB. In various embodiments, each USB line may carry data in a bidirectional manner, and may require only two electrical lines. Each USB line may be coupled at one end to hub circuitry 709 on the processor board 712, and at the other end to a USB transceiver 717 on a peripheral board (721,722) connected to board circuitry 719. The hub circuitry 709 of the processor board 712 might exchange data between the circuitry on the processor board and other boards. For example, in some embodiments, a microprocessor might exchange data through the USB lines to the peripheral boards.

In some embodiments, the hub circuitry may comprise one or more USB root hubs. These hubs may be coupled to circuitry on the processor board. In various embodiments, the USB root hub(s) may be configured by software to allocate data bandwidth to each peripheral board in a flexible manner, allowing the processor board to allocate large amounts to high-bandwidth peripheral boards and low amounts to low bandwidth boards. In addition, for high-bandwidth needs, one or more USB lines may be served by one or more corresponding dedicated USB root hubs.

In some embodiments, a link-alignment and connector structure may be included on the peripheral boards that enable the boards to be stacked over one another. The boards may also be stacked over a processor board, under the processor board, or both. In some embodiments, the structure of the USB lines might further allow each USB line to be routed to a particular peripheral board. In some embodiments, each peripheral board might be moved around in the stack while maintaining a point-to-point connection to the processor board without the need for any addressing circuitry. Some embodiments may include a hub board that may be used to serve additional peripheral boards from an existing USB line of a processor board. In various embodiments, boards in an embedded system may use USB-based communications with boards that are interchangeable and interoperable, and mechanically compatible. Other communication systems might also be used.

The processor board 712 and the first four peripheral boards (721,722) stacked above the processor board are illustrated in FIG. 7. Each board may have a first connector 106 and a second connector 107. In various embodiments, the processor board 712, located at the bottom of the figure, may comprise hub circuitry 709. This hub circuitry may have five downstream ports D1T, D2T, D3T, D4T, and D5T and five additional downstream ports D1B, D2B, D3B, D4B, and D5B. Downstream ports, D1T, D2T, D3T, D4T, and D5T may provide five corresponding USB lines capable of going to five corresponding top-stacking boards. The additional downstream ports, D1B, D2B, D3B, D4B, and D5B, may provide five corresponding USB lines capable of going to five corresponding bottom-stacking boards. The hub circuitry 709 might be coupled to a processor 711 on the processor board 712.

In some embodiments, the hub circuitry may have a variety of implementations. For example, in one implementation, the hub circuitry 709 may comprise a first root hub that provides the downstream ports for the top-stacking peripheral boards, and a second root hub that provides the downstream ports for the bottom-stacking peripheral boards. In another implementation, the hub circuitry 709 may comprise a single root hub that provides some of the downstream ports, and a regular hub that provides the remaining downstream ports.

In various embodiments, the regular hub may have its upstream port coupled to a downstream port of the root hub. For example, the root hub may provide the downstream ports D1T, D2T, D3T, D1B, D2B, and D3B, and the regular hub may provide the downstream ports D4T, D5T, D4B, and D5B. In other embodiments, the hub circuitry may comprise a root hub coupled to two regular hubs, with one regular hub providing the downstream ports to the top-stacking boards and the other regular hub providing the downstream ports to the bottom-stacking boards.

In one exemplary implementation, the electrical lines of the downstream ports D1T-D5T may be coupled to respective pins of the first connector of the processor. For example, pins 36 and 38 for D1T+ and −, pins 48 and 50 for D2T+ and −, pins 43 and 41 for D3T+ and −, pins 31 and 29 for D4T+ and −, and pins 17 and 15 for D5T+ and −. These signal lines are coupled to the same numbered pins of the second connector disposed on the first peripheral board stacked above the processor board.

Also in the exemplary implementation, the electrical lines of the downstream ports D1B-D5B may be coupled to respective pins of the second connector of the processor board. For example, in some embodiments, pins 32 and 30 for D1B+ and −, pins 44 and 42 for D2B+ and −, pins 47 and 49 for D3B+ and −, pins 35 and 37 for D4B+ and −, and pins 21 and 23 for D5B+ and −. These pins would couple to the same numbered pins of the first connector disposed on the first peripheral board that may be stacked below the processor board 712. The processor board 712 may provide a first orientation signal "Sense+" (713a) coupled to pin 22 of the first connector, and a second orientation signals "Sense−" (713b) coupled to pin 22 of the second connector, with different voltages being coupled to the orientation signals, such as +5 V to Sense+ and 0 V to Sense−. These orientation signals 713 allow circuitry on each peripheral board to determine if the peripheral board (721,722) is in a top-stacking position or a bottom-stacking position.

In some embodiments, the processor board may further comprise an I2C controller 707 to provide an Inter-Integrated Circuit (I2C) serial bus (725,727) to the peripheral boards (721,722). The I2C bus (725,727) is a known bus protocol, and further information about it may be found on the Internet. The I2C controller may 707 be coupled to the processor 711 of the processor board 712 by any known bus structures. In the exemplary implementation, the I2C controller 707 provides a clock signal I2C_SCK on pins 3 of both the first and second connectors, and data signals I2C_SDA on pins 5 of the first and second connectors, and enables the peripheral boards (721,722) to communicate with one another as another communications option. In addition, the processor board may provide a general reset signal 705 on pins 24 of the first and second connectors.

In various embodiments, power 703 and ground 701 may be provided on a number of other pins of the first and second connectors. For example, in some embodiments, 3.3 V may be provided on pins 4, 6, and 10 of both connectors. In some embodiments, 5 V may be provided on pins 12, 16, and 18 of both connectors and ground provided on pins 1-2, 7-8, 13-14, 19-20, 25-28, 33-34, 39-40, 45-36, and 51-53 of both connectors. In various embodiments, the processor board may provide a supply voltage to each power-supply pin. The supply voltage may have a minimum available current. For example, the minimum available current might be at least one and one-half amperes per pin in some embodiments in a stackable USB system.

The features of the first top-stacked peripheral board are now discussed. The first top-side USB line D1T from the processor is intended to serve the first top-stacked board. USB line D1T is routed to the first top-stacked peripheral board by way of pins 36 and 38 of the board's second connector (bottom connector). From there, in some embodiments, the first USB line D1T is routed to a USB transceiver 717 on the peripheral board by way of a bidirectional analog multiplexer 715. Other embodiments might use solderable jumpers for connection or isolation. The orientation signal on pin 22 is routed to the selector input of the analog multiplexer 715, and the multiplexer is connected such that USB line D1T is routed through the multiplexer with the orientation signal equal to Sense+(Sense=Sense+). As used herein, the tem "analog multiplexer" broadly encompasses any circuitry that enables signal lines to be multiplexed. In various embodiments, the signal lines may be multiplexed with bidirectional data flow maintained in, for example, a USB line. The analog multiplexer 715 or other isolation device may provide isolation between conductors on the top and bottom connectors of a board. The other input of the analog multiplexer 715 may be coupled to pins 32 and 30 of the board's first connector (top-side connector), which would couple the first bottom-side USB line D1B to the analog multiplexer if this peripheral board were mounted below the processor board, instead of above it. If this peripheral board were mounted below the processor board, the value of the orientation signal would change to select these pins to be routed to the USB transceiver 717. In this way, the board may be placed in a top-stacking or bottom-stacking position, and the appropriate USB line will be automatically routed to the USB transceiver 717 with the assistance of the orientation signal Sense 713.

Another feature of the first peripheral board illustrated in FIG. 7. A first pair of electrical traces A may be used to route the second USB line D2T at pins 48 and 50 of the second connector (bottom connector) to pins 36 and 38 of the first connector (top connector). Traces A effectively route USB line D2T presented at the bottom of the peripheral board to the position for USB line D1T at the top of the peripheral board, and enables second USB line D2T to be routed to the USB transceiver 717 of the second top-stacked peripheral board, which may be stacked immediately above the first top-stacked peripheral board. In a similar manner, a second pair of electrical traces B may be used to route the third USB line D3T at pins 43 and 41 of the second connector (bottom connector) to pins 48 and 50 of the first connector (top connector). Traces B effectively route USB line D3T presented at the bottom of the peripheral board to the position for USB line D2T at the top of the peripheral board. Traces B of the first top-stacked peripheral board and traces A of the second top-stacked board enable the USB line D3T from the processor board to be routed to the USB transceiver 717 of the third top-stacked peripheral board. In a similar manner, two additional pairs C and D of electrical traces may be provided in each peripheral board. These traces may enable the routing of the fourth USB line D4T from the processor board to the USB transceiver 717 of the fourth top-stacked peripheral board and the routing of the fifth USB line D5T from the processor board to the USB transceiver 717 of the fifth top-stacked peripheral board. Third pair C of traces couples pins 31 and 29 of the second connector (bottom connector) to pins 43 and 41 of the first connector (top connector), respectively, and fourth pair D of traces couples pins 17 and 15 of the second connector (bottom connector) to pins 31 and 29 of the first connector (top connector), respectively. As described below in greater detail, four additional pairs of electrical traces W, X, Y, and Z are used to provide the same type of routing to the bottom-stacked peripheral boards.

Pins 22 of the first and second connectors on each peripheral board (and each hub board described below) may be coupled together in order to convey the orientation signal Sense up 713a the topside stack of peripheral boards. Likewise, pins 3 of both connectors may be coupled together to convey clock signal I2C_SCK upwards (725,727). Additionally, pins 5 of both connectors may be coupled together to convey data signal I2C_SDA upwards (725,727). Pins 24 of both connectors may be coupled together to convey the reset signal 705, RESET, upwards. Pins 4, 6, and 10 of both connectors may be coupled together to convey the +3.3 V power upwards. Pins 12, 16, and 18 of both connectors may be coupled together to convey the +5 V power upwards. Pins 1-2, 7-8, 13-14, 19-20, 25-28, 33-34, 39-40, 45-36, and 51-53 of both connectors are coupled together to convey ground 701 upwards. These signals may be tapped off by each peripheral board as needed. As illustrated in the topmost peripheral board in FIG. 7, the analog multiplexer 715 may be replaced by, for example, solderable connectors 714. These solderable connectors may connect pins 36 and 38 of the board's second, or lower connector to the board's USB transceiver 717 when the board is used in the top-stacked position. Additionally, the solderable connectors that connect pins 32 and 30 of the board's first, or top connector to the board's USB transceiver when the board is used in the bottom-stacked position.

Figure 8:
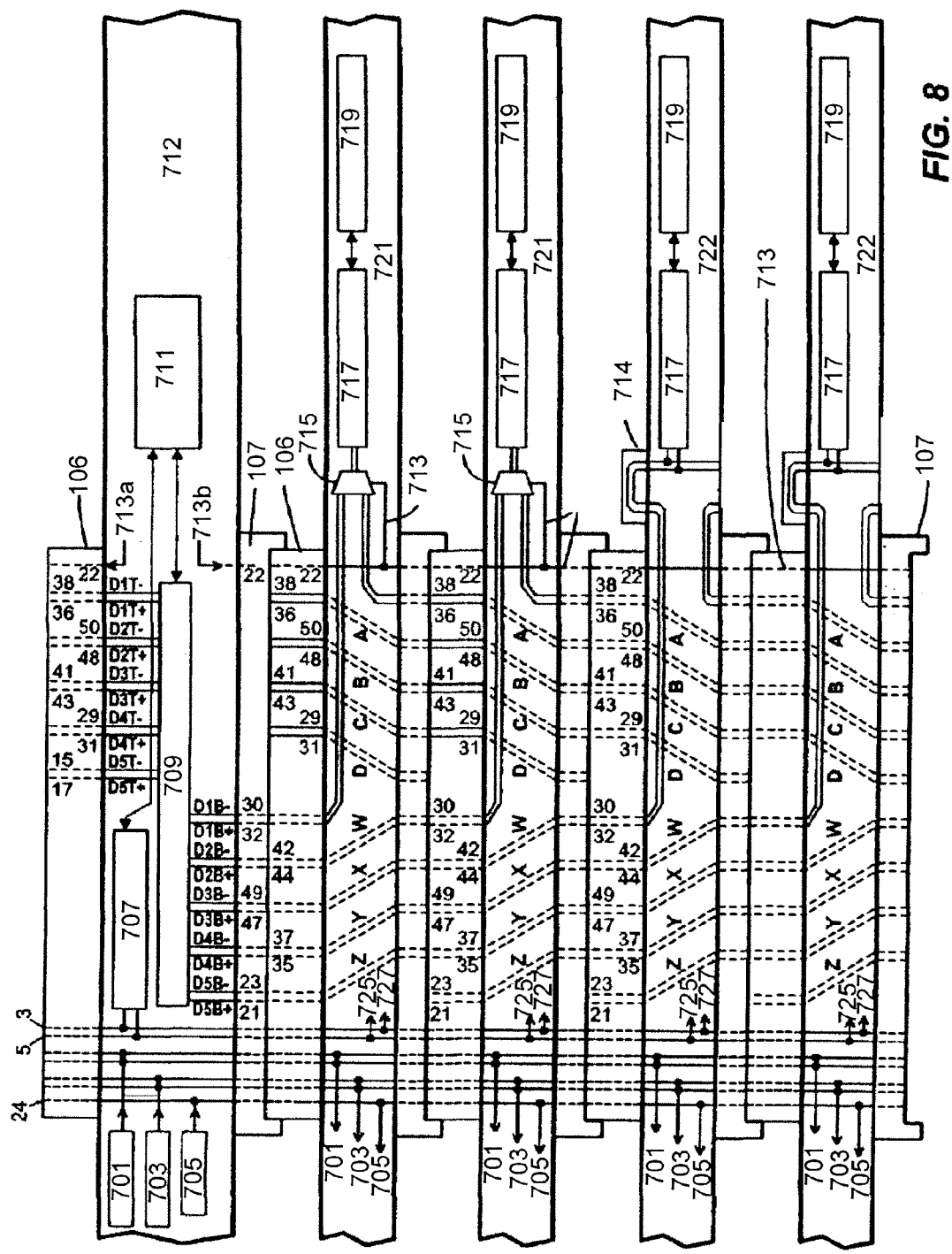
FIG. 8 is a partial cross-sectional circuit diagram illustrating the electrical connections in the bottom portion of the exemplary system illustrated in FIG. 1 according to the methods and systems described herein.

FIG. 8 is a partial cross-sectional circuit diagram illustrating the electrical connections in the bottom portion of the system illustrated in FIG. 1. The processor board 712 and the first four peripheral boards (721, 722) stacked below the processor board are illustrated, each board having a first connector and a second connector, as described above. In the example embodiment, the processor board 712, located at the top of the figure, is the same processor board 712 described in FIG. 7.

The bottom-stacking peripheral boards comprise the same basic elements as the top-stacking peripheral boards described above. The first bottom side USB line D1B from the processor board 712 may be intended to serve the first bottom-stacked board. USB line D1B can be routed to this peripheral board by way of pins 32 and 30 of the peripheral board's second connector 107 (bottom connector). From there, the first USB line D1B may be routed to a USB transceiver on the first bottom-stacked peripheral board by way of a bidirectional analog multiplexer 715. The orientation signal on pin 22 may be routed to the selector input of the analog multiplexer, and the multiplexer may be connected such that USB line D1B is routed through the multiplexer with the orientation signal Sense 713 equal to Sense– 713b (Sense=Sense–). The other input of the analog multiplexer 715 may be coupled to pins 36 and 38 of the board's first connector (top-side connector), as described above.

As illustrated in the bottommost peripheral board in FIG. 8, the analog multiplexer 715 may be replaced by solderable connectors 714 that connect pins 32 and 30 of the board's first connector'(top connector) to the board's USB transceiver when the board is used in the bottom-stacked position. Other embodiments might use other types of input selection and isolation. For example, in some embodiments a fabric switch or other type of switch might be used.

The second bottom-side USB line D2B from the processor board may be presented at pins 44 and 42 of the first connector of the first bottom-stacked peripheral board. In the example embodiment, USB line D2B is intended to serve the second bottom-stacked peripheral board, which is stacked immediately below the first bottom-stacked peripheral board. A pair of electrical traces W of the first peripheral board routes USB line D2B at pins 44 and 42 of the first connector (top connector) to pins 32 and 30 of the second connector (bottom connector). Traces W effectively route USB line D2B presented at the top of the peripheral board to the position for USB line D1B at the bottom of the peripheral board, and enables second USB line D2B to be routed to the USB transceiver of the second bottom-stacked peripheral board. In a similar manner, another pair of electrical traces X of the first peripheral board routes the third bottom-side USB line D3B at pins 47 and 49 of the first connector (top connector) to pins 44 and 42 of the second connector(bottom connector). Traces X effectively route USB line D3B presented at the top of the peripheral board to the position for USB line D2B at the bottom of the peripheral board. Traces X of the first bottom-stacked peripheral board and traces W of the be routed to the USB transceiver of the third bottom-stacked peripheral board.

In a similar manner, two additional pairs Y and Z of electrical traces may be provided in each peripheral board. This can enable the routing of the fourth bottom-side USB line D4B from the processor board to the USB transceiver of the fourth bottom-stacked peripheral board, and the routing of the fifth bottom-side USB line D5B from the processor board to the USB transceiver of the fifth bottom-stacked peripheral board. The pair Y of traces couples pins 35 and 37 of the first connector (top connector) to pins 47 and 49 of the second connector (bottom connector), respectively, and the pair Z of traces couples pins 21 and 23 of the first connector (top connector) to pins 35 and 37 of the second connector (bottom connector), respectively.

Pins 22 of the first and second connectors are coupled together in order to convey the orientation signal Sense down the bottom-side stack of peripheral boards. Likewise, pins 3 of both connectors may be coupled together. Accordingly, clock signal I2C-SCK may be conveyed downward through the board. In some embodiments, pins 5 of both connectors may be coupled together to convey data signal I2C-SDA downward. Additionally, pins 24 of both connectors may be coupled together to convey the reset signal RESET downwards. Additionally, pins 4, 6, and 10 of both connectors may be coupled together to convey the +3.3 V power downwards. Pins 12, 16, and 18 of both connectors may also coupled together to convey the +5 V power downwards. In some embodiments, pins 1-2, 7-8, 13-14, 19-20, 25-28, 33-34, 39-40, 45-36, and 51-53 of both connectors may be coupled together to convey ground downwards. These signals may be tapped off by each peripheral board as needed.

It will be appreciated by those of skill in the art that additional pins of the first and second connectors may be designated to convey additional USB lines in either or both directions (up and/or down) and that additional electrical traces may be added to route these lines through the peripheral board.

FIG. 9 illustrates another exemplary embodiment of a processor board 710, where the board's hub circuitry provides five downstream USB ports that are shared between ports D1T-D5T and D1B-D5B, respectively. In some embodiments, one downstream port may be coupled to both of ports D1T and D1B, another downstream port may be coupled to both of ports D2T and D2B, and so forth. With this configuration, the peripheral boards may only be stacked on one side of the processor board (e.g., top-stacking or bottom-stacking, but not both simultaneously). While this configuration limits the boards to one side, it enables a lower-cost processor board to be made.

It may be appreciated that any of the processor boards described above may omit its second connector (bottom connector) and be only for top-stacking of peripheral boards. Similarly, any processor board may omit its first connector (top connector) and be only for bottom-stacking of peripheral boards.

Figure 11:
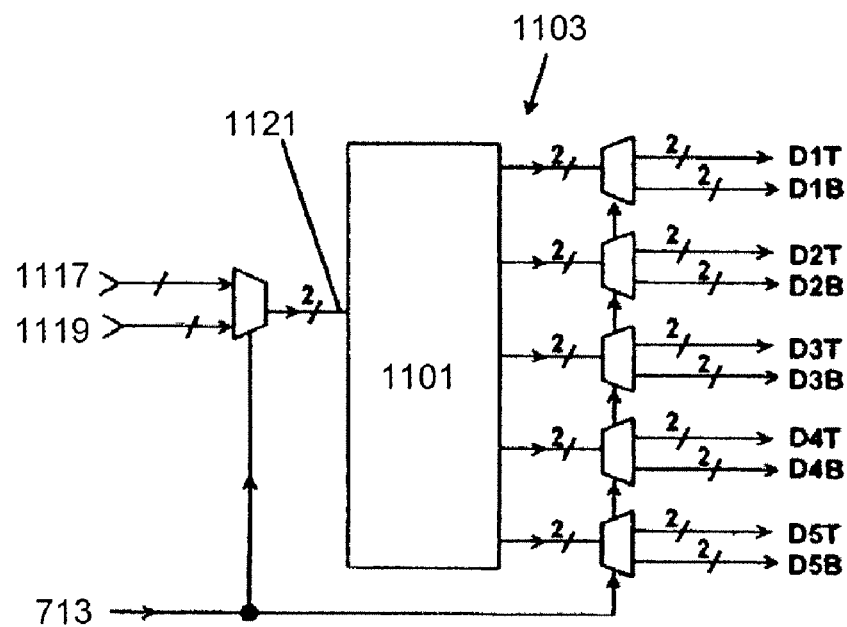
FIG. 11 illustrates a schematic diagram of an exemplary implementation of the hub circuitry of the exemplary hub board illustrated in FIG. 10 according to the methods and systems described herein.

Some system applications may require a large number of peripheral boards (e.g., more than five) stacked on one side of a processor board. In some embodiments, 8 boards might be allowed above a processor board and 8 boards might be allowed below a processor board, for a total of 16 boards. In other embodiments, one or more hub boards might be used to allow this. As another invention of the present application, a hub board 901 may be provided for more USB lines, as illustrated in FIG. 10. The hub board 901 comprises hub circuitry that provides five downstream ports for USB lines D1T-D5T at the first connector and five downstream ports for USB lines D1B-D5B at the second connector, just as is done in the exemplary processor board illustrated in FIG. 7, and at the same exemplary pin locations as the processor board illustrated in FIG. 7. The hub circuitry further comprises a first upstream port coupled to pins 36 and 38 of the board's second connector. This upstream port may be for receiving packets to be transmitted to downstream ports D1T-D5T provided at the first connector, and for transmitting packets that are received from downstream ports D1T-D5T. The hub circuitry further comprises a second upstream port coupled to pins 32 and 30 of the board's first connector. This upstream port may be for receiving packets to be transmitted to downstream ports D1B-D5B provided at the second connector, and for transmitting packets that are received from downstream ports D1B-D5B. FIG. 11 illustrates a schematic diagram of an exemplary implementation of the hub circuitry 709. It comprises a regular USB hub 1101 having one upstream port 1121 and five downstream ports 1103. The hub's upstream port may be coupled to the output of an analog multiplexer, which selectively couples it to either the first upstream port 1117 or the second upstream port 1119 of the board, depending upon the value of the orientation signal Sense 713. In some embodiments, when the hub board is placed in a top-stacking position, the first upstream port is selected, when the hub board is placed in a bottom-stacking position, the second upstream port is selected. Each of the hub's five downstream ports (x=1, 2, . . . , 5) may be coupled to the output of a respective analog multiplexer, and the inputs of the analog multiplexer are coupled to the corresponding pins for USB lines DxT and DxB (x=1, 2, . . . , 5). The selector input of each of these analog multiplexers may be coupled to the orientation signal Sense. When the hub board is placed in a top-stacking position, the hub's downstream ports (x=1, 2, . . . , 5) are coupled to respective ones of D1T-D5T. When the hub board is placed in a bottom-stacking position, the hub's downstream ports (x=1, 2, . . . , 5) are coupled to respective ones of D1B-D5B. Instead of using analog multiplexers, solderable connectors may be used to configure the hub circuitry for either the topstacking position or the bottom-stacking position. Other methods might also be used to provide selection and isolation.

It may be appreciated that a hub board may be constructed so that it only works in the top-stacking position, or only works in the bottom-stacking position. For a top-stacking only hub board, the first upstream port may be directly coupled to the upstream port of the USB hub, and the board's downstream ports D1T-D5T may be directly coupled to respective one of the USB hub's downstream ports (x=1, 2, . . . , 5). For a bottom-stacking only hub board, the second upstream port may be directly coupled to the upstream port of the USB hub, and the board's downstream ports D1B-D5B may be directly coupled to respective ones of the USB hub's downstream ports (x=1, 2, . . . , 5).

Pins 22 of the first and second connectors of the hub board are coupled together in order to convey the orientation signal Sense through the stack of boards. Likewise, pins 3 of both connectors are coupled together to convey clock signal I2C_SCK through the stack, pins 5 of both connectors are coupled together to convey data signal I2C_SDA through the stack, and pins 24 of both connectors are coupled together to convey the reset signal RESET through the stack.

Figure 12:
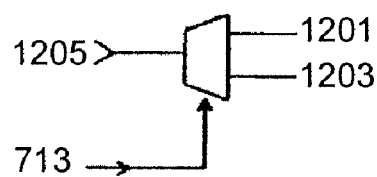
FIG. 12 illustrates a schematic diagram of an exemplary implementation of the power circuitry of the exemplary hub board illustrated in FIG. 10 according to the methods and systems described herein.

As another exemplary feature of an exemplary hub board, the hub board provides new power sources for the power supplies to the boards for which it provides USB lines. In various embodiments, if the hub board is stacked above the processor board, then the hub board provides new power sources 1201 to the boards above the hub board; and if the hub board is stacked below the processor board, then the hub board provides new power sources 1203 to the boards below the hub board. The multiplexer circuit illustrated in FIG. 12 may be used to provide this feature. As an example, the multiplexer circuit may comprise two power transistors, with one having its gate terminal (or base terminal) coupled to the orientation signal 713 and the other having its gate terminal (or base terminal) coupled to the output of an inverter, which in turn has its input coupled to the orientation signal 713.

Figure 13:
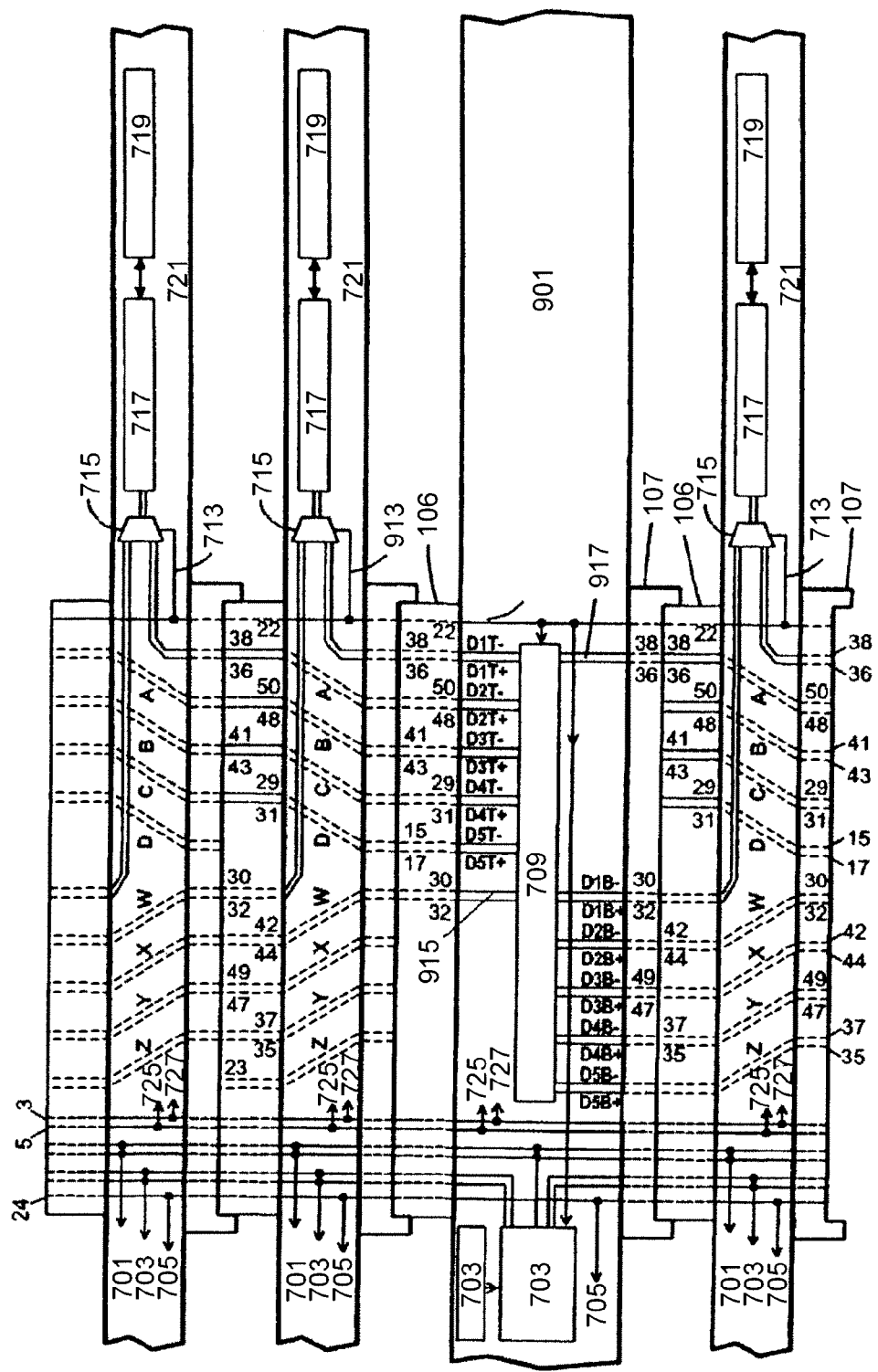
FIG. 13 illustrates a partial cross-sectional circuit diagram of an exemplary hub board with peripheral boards according to the methods and systems described herein.

As an exemplary configuration, FIG. 13 illustrates an exemplary hub board 901 in the top stacking position, with a peripheral board disposed on either side of the hub board. A USB line feeds the first upstream port of the hub board through pins 36 and 38, and the hub circuitry provides new USB lines on its downstream ports MT-D5T at the first connector (top connector).

FIGS. 14-19 illustrate an example plan views of the pins of the first and second connectors of the exemplary processor, peripheral, and hub boards, and the exemplary signal assignments used herein. It will be understood that other pin layouts are possible.

Figure 20:
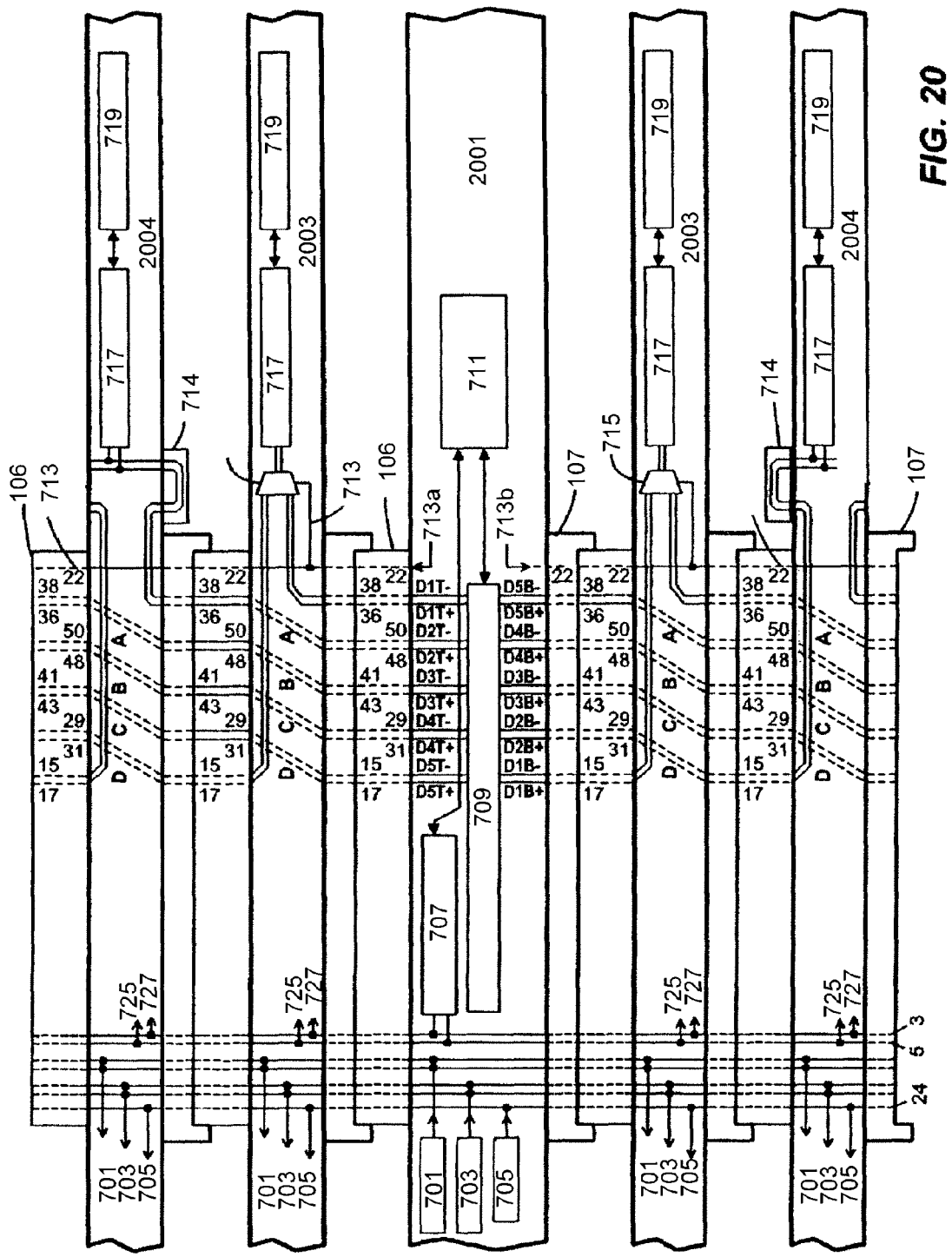
FIG. 20 is a partial cross-sectional circuit diagram illustrating the electrical connections in another exemplary system according to the methods and systems described herein.

In the above exemplary implementations, one group of traces in the peripheral boards, traces A-D, may be used to route USB lines to the top-stacked peripheral and hub boards, and another group of traces in the peripheral boards, traces W-Z, may be used to route USB lines to the bottom-stacked peripheral and hub boards. It may be appreciated that one set of traces may be used to do both of these routing functions. This is illustrated in FIG. 20, where traces A-D in the peripheral boards (2003, 2004) are used, and traces W-Z are omitted. The routing of signals to the top-stacking boards occurs the same way with traces A-D as previously described. What is different is the routing of USB signals to the bottom-stacking boards. Looking at the processor board 2001, the couplings of the electrical lines of the downstream ports D1B-D5B are done differently. Instead, the electrical lines of the downstream ports D1B-D5B are coupled to respective pins of the second connector of the processor board as follows: pins 17 and 15 for D1B+ and −, pins 31 and 29 for D2B+ and −, pins 43 and 41 for D3B+ and −, pins 48 and 50 for D4B+ and −, and pins 36 and 38 for D5B+ and −. Looking at the periphery boards, the inputs for USB lines D1B are at pins 17 and 15, instead of pins 32 and 30.

Figure 21:
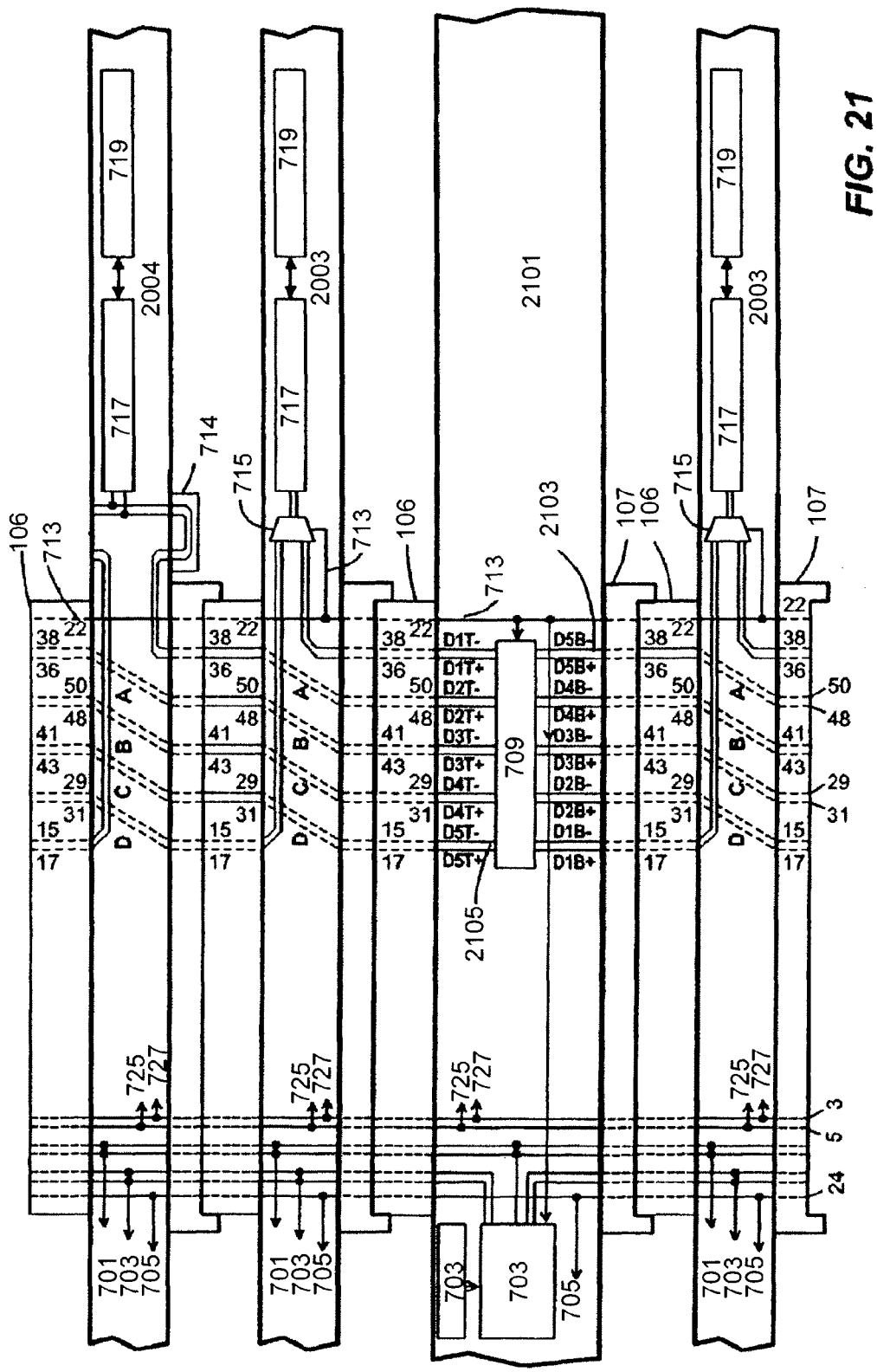
FIG. 21 illustrates an exemplary hub board in accordance with the methods and systems described herein.
Figure 22:
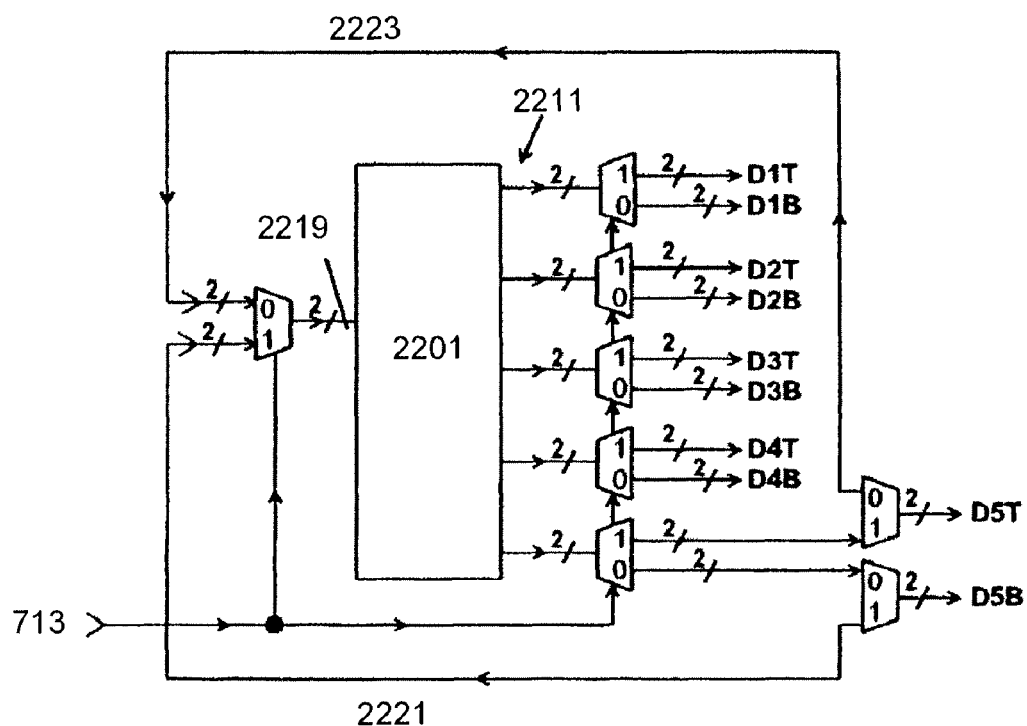
FIG. 22 illustrates a circuitry diagram of exemplary hub circuitry for a hub board in accordance with the systems and methods described herein.
Figure 23:
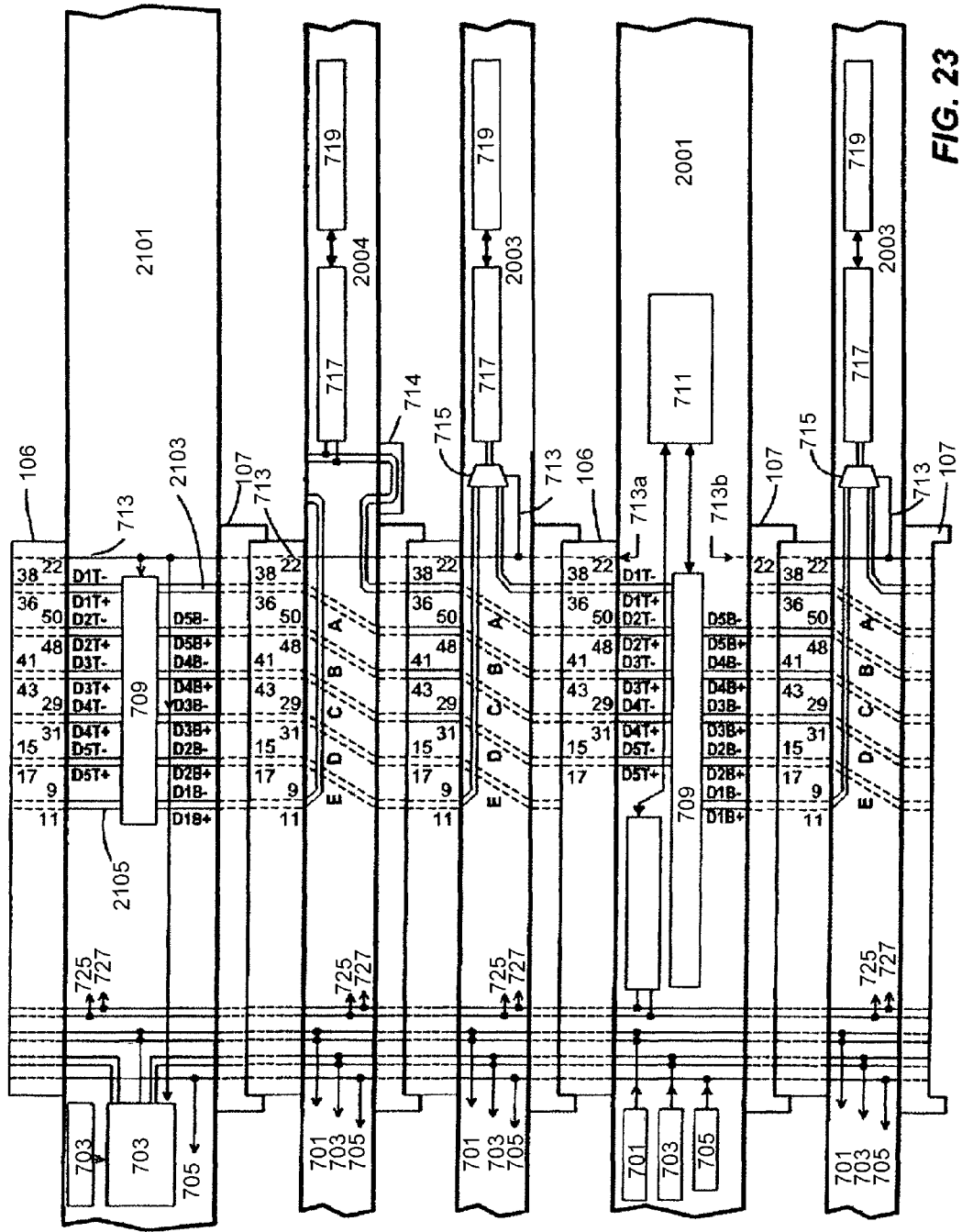
FIG. 23 illustrates an approach that provides a set of pins on each of the first and second connectors that can be designated to receive the USB lines for the first and second upstream ports of the hub circuitry in accordance with the methods and systems described herein.

An exemplary hub board 2101 for this system is illustrated in FIG. 21. The exemplary hub board 2101 has the same pin assignments for ports D1T-D5T and D1B-D5B as the processor board 2001 illustrated in FIG. 20. The first upstream port for the hub circuitry 709 may be multiplexed on port DB5, and the second upstream port may be multiplexed on port DT5. A layer of de-multiplexing may be used in the hub circuitry to separate these signals. The circuitry diagram of exemplary hub circuitry 709 for the hub board 2101 is illustrated in FIG. 22 as having an orientation signal 713, upstream ports 2219, downstream ports 2211, a first upstream port 2223, and a second upstream port 2221. In some embodiments, the layer of de-multiplexing is not needed when the hub board is designed to operate in only a top-stacking position, or only a bottom-stacking position. The need for the additional layer of de-multiplexing may be avoided by designating a set of pins in both the first and second connectors of the processor board to convey dedicated USB lines for a first top-stacking hub board and a first bottom-stacking hub board. These lines would be propagated as through-connections in the peripheral boards. The first hub board in the stack could then provide a new USB line to be made available to the next hub board in the stack. As another approach to avoiding the additional layer of de-multiplexing, an additional pair E of electrical traces may be added to the peripheral boards, and the assignment of the pins to ports D1B-D5B may be shifted to the left by one pair over that illustrated in FIG. 20. This provides a set of pins on each of the first and second connectors that can be designated to receive the USB lines for the first and second upstream ports of the hub circuitry. This approach is illustrated in FIG. 23. As another approach to avoiding the additional layer of de-multiplexing, the hub board may omit the downstream ports D5T and D5B, and only provide four USB lines for four peripheral boards stacked either above or below the hub board (e.g., provide downstream ports for D1T-D4T and D1B-D4B). This eliminates the multiplexing of the first and second upstream ports with D5B and D5T.

Figure 24:
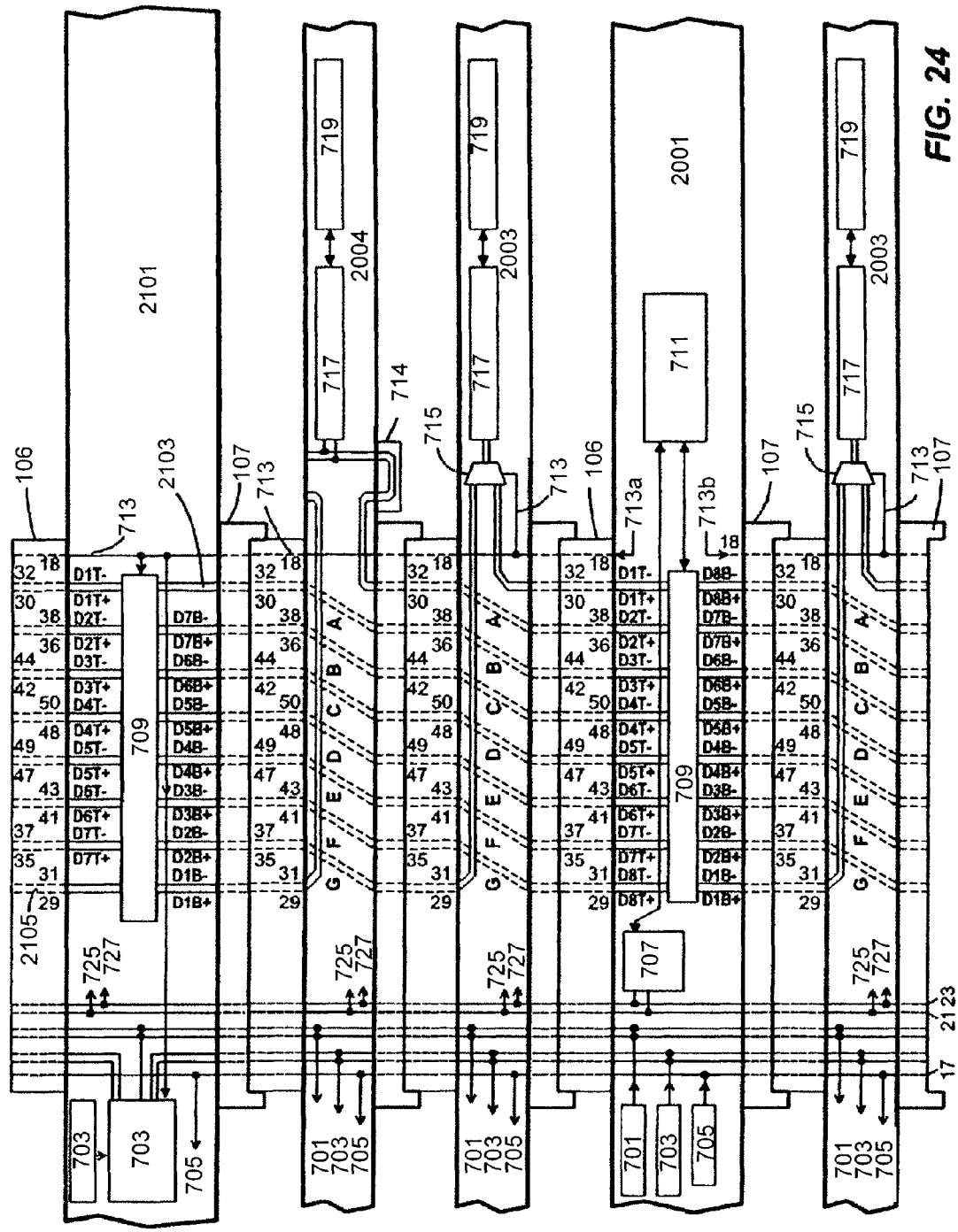
FIG. 24 illustrates another set of exemplary embodiments of a processor, peripheral, and hub boards in accordance with the methods and systems described herein.

FIG. 24 illustrates another set of exemplary embodiments of processor 2001, peripheral (2003, 2004), and hub boards 2101 in accordance with the methods and systems described herein. These embodiments may enable a processor board to provide, for example, eight USB lines D1T-D8T at eight downstream ports D1T-D8T and eight USB lines D1B-D8B at eight downstream ports D1B-D8B. These USB lines may be downstream to the processor board's second connector. In this way, each peripheral may receive eight USB lines from its first connector and eight USB lines from its second connector. In some embodiments, each hub board may provide seven additional USB lines D1T-D7T at seven downstream ports D1T-D7T to the hub board's first connector, and seven USB lines D1B-D7B at seven downstream ports D1B-D7B to the hub board's second connector. The pin assignments are different from previously-described embodiments, and are given in Table I for the processor board:

TABLE I

| Pin Number | First Connector | Second Connector |
| --- | --- | --- |
| 30 | D1T+ | D8B+ |
| 32 | D1T− | D8B− |
| 36 | D2T+ | D7B+ |
| 38 | D2T− | D7B− |
| 42 | D3T+ | D6B+ |
| 44 | D3T− | D6B− |
| 48 | D4T+ | D5B+ |
| 50 | D4T− | D5B− |
| 47 | D5T+ | D4B+ |
| 49 | D5T− | D4B− |
| 41 | D6T+ | D3B+ |
| 43 | D6T− | D3B− |
| 35 | D7T+ | D2B+ |
| 37 | D7T− | D2B− |
| 31 | D8T+ | D1B+ |
| 29 | D8T− | D1B− |

The exemplary peripheral board has three additional traces E, F, and G to provide for the routing of three additional USB lines. The connections of the pins of the first and second connectors of the exemplary peripheral board to the traces and USB transceiver are given in Table II below, and illustrated in the figure. The connections of the pins of the first and second connectors of the exemplary hub board to ports of the hub circuitry are given in Table III below, and illustrated in the figure.

In the boards of this implementation, the orientation signals Sense, Sense+, and Sense are provided on pins 18 of the first and second connectors (with the hub and peripheral boards having these pins connected together), as illustrated in FIG. 24. In each of the boards of this exemplary implementation, clock signal I2C_SCK may be provided on pins 21 of the first and second connectors. For example, each board may have these pins connected together. Data signal I2C_SDA may be provided on pins 23 of the first and second connectors. Additionally, in some embodiments, each board may have these pins connected together. In various embodiments, the reset signal, RESET, may be provided on pins 17 of the first and second connectors. Additionally, each board may have these pins connected together. Power and ground may be provided on the remaining pins, with, for example, up to five pins being used for 3.3V and up to five being used for 5V.

TABLE II

| Pin Number on First Connector | Trace Pair | Pin Number on Second Connector |
| --- | --- | --- |
| — | To USB Transceiver | 30 |
|  |  | 32 |
| 30 | TraceA+ | 36 |
| 32 | Trace A− | 38 |
| 36 | Trace B+ | 42 |

TABLE II-continued

| Pin Number on First Connector | Trace Pair | Pin Number on Second Connector |
|---|---|---|
| 38 | Trace B– | 44 |
| 42 | Trace C+ | 48 |
| 44 | Trace C– | 50 |
| 48 | Trace D+ | 47 |
| 50 | TraceD– | 49 |
| 47 | TraceE+ | 41 |
| 49 | Trace E– | 43 |
| 41 | TraceF+ | 35 |
| 43 | Trace F– | 37 |
| 35 | TraceG+ | 31 |
| 37 | Trace G– | 29 |
| 31 | ToUSB Transceiver | — |
| 29 | | |

TABLE III

| Pin Number | First Connector | Second Connector |
|---|---|---|
| 30 | D1T+ | First Up-stream Port |
| 32 | D1T– | |
| 36 | D2T+ | D7B+ |
| 38 | D2T– | D7B– |
| 42 | D3T+ | D6B+ |
| 44 | D3 T– | D6B– |
| 48 | D4T+ | D5B+ |
| 50 | D4T– | D5B– |
| 47 | D5T+ | D4B+ |
| 49 | D5T– | D4B– |
| 41 | D6T+ | D3B+ |
| 43 | D6T– | D3B– |
| 35 | D7T+ | D2B+ |
| 37 | D7T– | D2B– |
| 31 | Second Up-stream Port | D1B+ |
| 29 | | D1B– |

Figure 25:
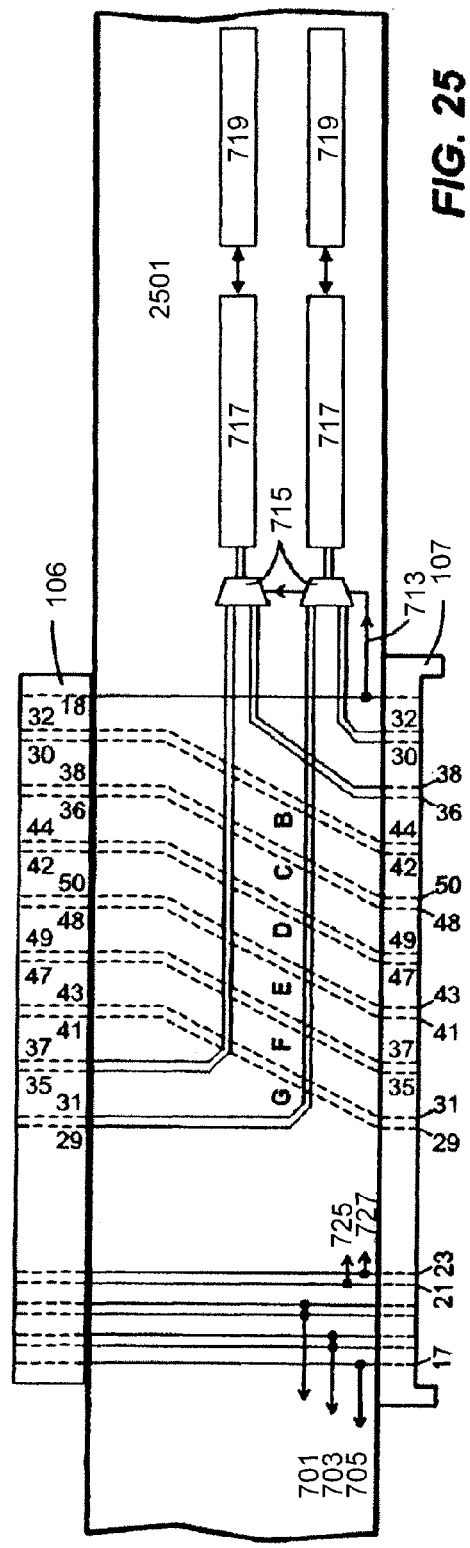
FIG. 25 illustrates an exemplary peripheral board which uses two USB lines.
Figure 26:
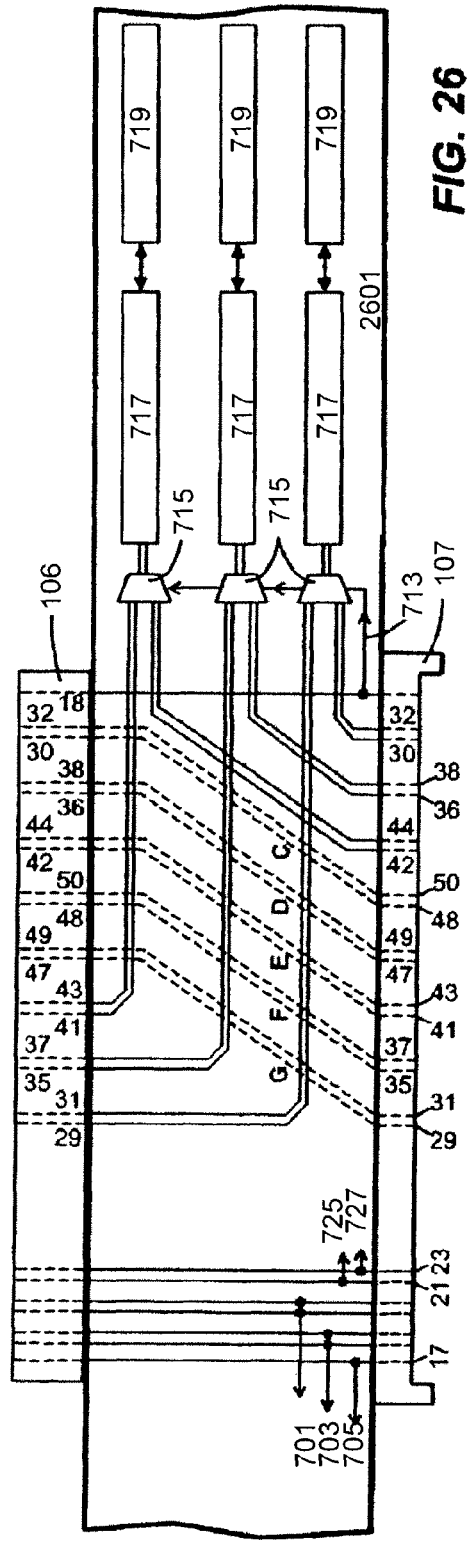
FIG. 26 illustrates an exemplary peripheral board which uses three USB lines.

In the above examples of peripheral boards, one USB line was provided to each peripheral board. It may be appreciated that a peripheral board may use two or more USB lines. In that case, the routing of the traces is different. FIG. 25 illustrates an exemplary peripheral board 2501 which uses two USB lines, and FIG. 26 illustrates an exemplary peripheral board 2601 which uses three USB lines. Trace A is omitted in the example illustrated in FIG. 25, and trace A and B are omitted in the example illustrated in FIG. 26. The connections of the pins of the first and second connectors of the exemplary peripheral board to the traces and USB transceivers for the embodiment illustrated in FIG. 25 are given in Table IV below, and illustrated in the figure. The connections of the pins of the first and second connectors of the exemplary peripheral board to the traces and USB transceivers for the embodiment illustrated in FIG. 26 are given in Table V below, and illustrated in the figure. Constructions for peripheral boards that use four or more USB lines can be derived from these examples by extension.

TABLE IV

| Pin Number on First Connector | Trace Pair | Pin Number on Second Connector |
|---|---|---|
| — | To First USB Transceiver | 30 |
| | | 32 |
| — | To Second USB Transceiver | 36 |
| | | 38 |
| 30 | Trace B + | 42 |
| 32 | Trace B– | 44 |
| 36 | Trace C+ | 48 |

TABLE IV-continued

| Pin Number on First Connector | Trace Pair | Pin Number on Second Connector |
|---|---|---|
| 38 | Trace C– | 50 |
| 42 | Trace D+ | 47 |
| 44 | Trace D– | 49 |
| 48 | Trace E+ | 41 |
| 50 | Trace E– | 43 |
| 47 | Trace F+ | 35 |
| 49 | Trace F– | 37 |
| 41 | Trace G+ | 31 |
| 43 | Trace G– | 29 |
| 35 | To Second USB Transceiver | — |
| 37 | | |
| 31 | To First USB Transceiver | — |
| 29 | | |
| — | To First USB Transceiver | 30 |
| | | 32 |
| — | To Second USB Transceiver | 36 |
| | | 38 |
| — | To Third USB Transceiver | 42 |
| | | 44 |
| 30 | Trace C+ | 48 |
| 32 | Trace C– | 50 |
| 36 | Trace D+ | 47 |
| 38 | Trace D– | 49 |
| 42 | Trace E+ | 41 |
| 44 | Trace E– | 43 |
| 48 | Trace F+ | 35 |
| 50 | Trace F– | 37 |
| 47 | Trace G+ | 31 |
| 49 | Trace G– | 29 |
| 41 | To Third USB Transceiver | — |
| 43 | | |
| 35 | To Second USB Transceiver | — |
| 37 | | |
| 31 | To First USB Transceiver | — |
| 29 | | |

Figure 27:
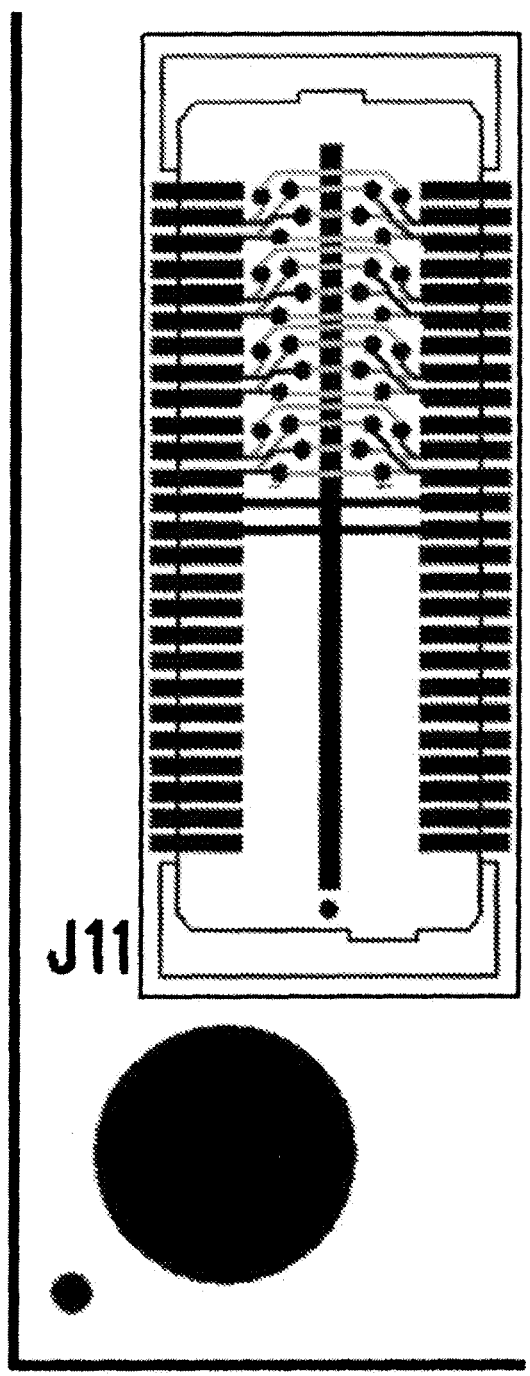
FIGS. 27-29 illustrate example layouts in accordance with the systems and methods described herein.
Figure 28:
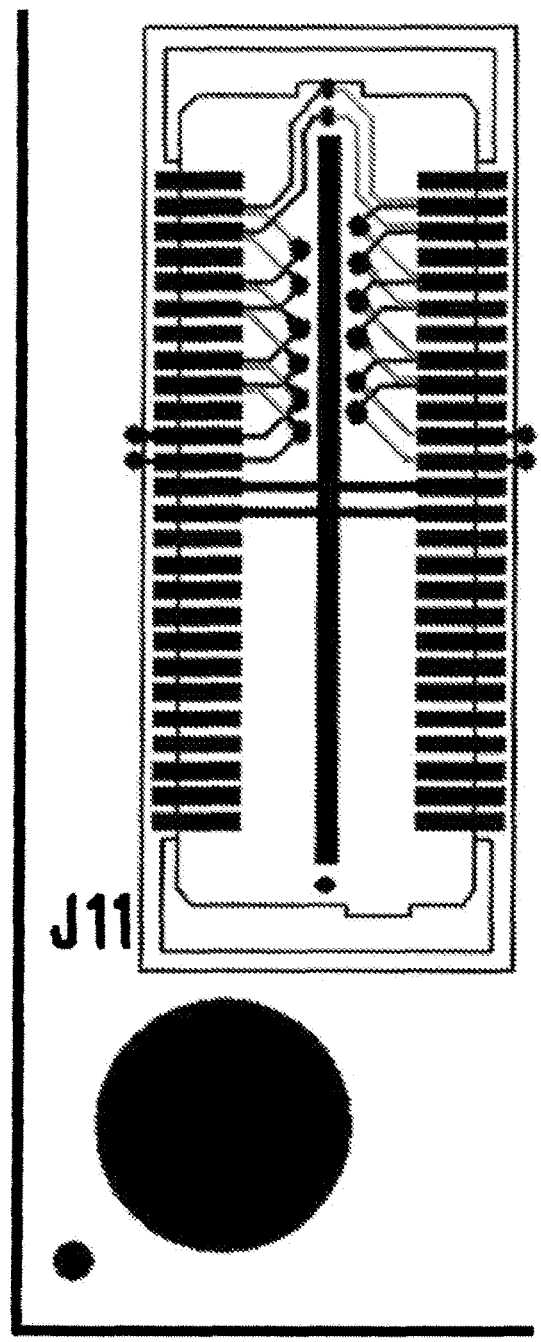
Figure 29:
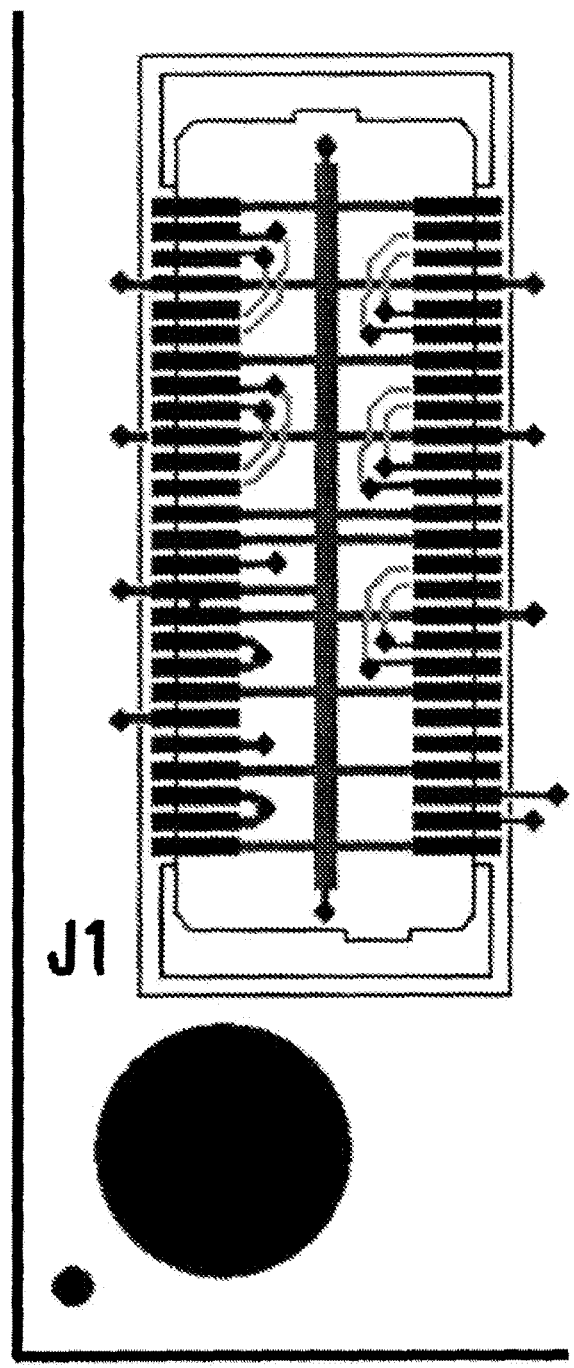

FIGS. 27-29 illustrate example layouts in accordance with the systems and methods described herein. In the example layouts, traces that are generally short are used. Additionally, the number of vias is generally low. This may reduce reflections due to impedance mismatches cause. For example, vias, connectors, plane crossings, etc may cause impedance mismatches. In general fewer impedance mismatches may lead to a cleaner the signal. Additionally, longer traces may increase the chance of crosstalk pickup with other signals. It will be appreciated by and that the pin layouts are only examples.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described. These exemplary embodiments and implementations can instead be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more," or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A stackable connector system for stackably interconnecting a plurality of circuit boards, each circuit board having a first side and a second side, comprising:
    a switching device configured to select a signal based on a location at which a first circuit board connects to a second circuit board;
    a sense line configured to communicate a location signal that indicates where the location is between the first circuit board and the second circuit board;
    a first connector comprising a first conductor element disposed at least partially within a first connector body, wherein the first connector is located on a first side of the first circuit board;
    a second connector comprising a second conductor element disposed at least partially within a second connector body, wherein the second connector is located on a second side of the first circuit board; and
    wherein the first and second connectors are configured to be connected to an electrical connection element on the first circuit board connecting the first conductor element to the second conductor element through the switching device, wherein the switching device maps the first conductor element to the second conductor element based on the location signal on the sense line.

2. The stackable connector system of claim 1, wherein the first conductor element comprises a pin.

3. The stackable connector system of claim 1, wherein the second conductor element comprises a pin receptacle.

4. The stackable connector system of claim 1, wherein the electrical connection element comprises a trace on the first circuit board.

5. The stackable connector system of claim 1, wherein the sense line couples the location signal to the switching device through a connection between the first and second connector.

6. The stackable connector system of claim 1, wherein the signal selected based on the location of the first circuit board comprises a signal connected from the first circuit board to the second circuit board through the first and second conductor elements in the first and second connectors.

7. The stackable connector system of claim 1, wherein the signal coupled to the first and second conductor elements comprises a Universal Serial Bus signal.

8. The stackable connector system of claim 1, wherein the location signal coupled to the sense line is generated by the second circuit board.

9. The stackable connector system of claim 1, wherein the second circuit board comprises a processor board.

10. The stackable connector system of claim 1, wherein the first circuit board comprises a peripheral board.

11. The stackable connector system of claim 1, wherein the switching device comprises a multiplexer.

12. A circuit board having a first side and a second side, comprising:
    a switching device configured to select a signal based on a location at which a first circuit board connects to a second circuit board;
    a sense line configured to communicate a location signal that indicates where the location is between the first circuit board and the second circuit board;
    a first connector comprising a first conductor element disposed at least partially within a first connector body, wherein the first connector is located on a first side of the first circuit board;
    a second connector comprising a second conductor element disposed at least partially within a second connector body, wherein the second connector is located on a second side of the first circuit board; and an electrical connection element on the circuit board connecting the first conductor element to the second conductor element through the switching device, wherein the switching device maps the first conductor element to the second conductor element based on the location signal on the sense line.

13. The circuit board of claim 12, wherein the first conductor element comprises a pin.

14. The circuit board of claim 12, wherein the second conductor element comprises a pin receptacle.

15. The circuit board of claim 12, wherein the electrical connection element comprises a trace on the circuit board.

16. The circuit board of claim 12, wherein the sense line couples the location signal to the switching device through a connection between the first and second connector.

17. The circuit board of claim 12, wherein the signal coupled to the first and second conductor elements comprises a Universal Serial Bus signal.

18. The circuit board of claim 12, wherein the circuit board comprises a peripheral board.

19. The circuit board of claim 12, wherein the switching device comprises a multiplexer.

20. An electronic system including a series of stacked circuit boards comprising:
   a processor board;
   a first peripheral board having a first side and a second side, coupled to the processor board, comprising:
      a switching device configured to select a signal based on a location at which the first peripheral board connects to the processor board;
      a sense line configured to communicate a location signal that indicates where the location is located between the first peripheral board is and the processor board;
      a first connector comprising a first conductor element disposed at least partially within a first connector body, wherein the first connector is located on a first side of the first peripheral board;
      a second connector comprising a second conductor element disposed at least partially within a second connector body, wherein the second connector is located on a second side of the first peripheral board; and
      an electrical connection element on the first peripheral board connecting the first conductor element to the second conductor element through the switching device, wherein the switching device maps the first conductor element to the second conductor element based on the location signal on the sense line; and
   a second peripheral board coupled to the processor board.

21. The electronic system of claim 20, wherein the first and second peripheral boards are configured to communicate serially with the processor board through separate connections.

22. The electronic system of claim 20, wherein the signal coupled to the first and second conductor elements comprises a Universal Serial Bus signal.

23. The electronic system of claim 20, wherein the switching device comprises a multiplexer.

24. The electronic system of claim 20, wherein the first peripheral board is located above the processor board and the second peripheral board is located above the first peripheral board.

25. The electronic system of claim 20, wherein the first peripheral board is located below the processor board and the second peripheral board is located below the first peripheral board.

* * * * *